(12) United States Patent
Saito et al.

(10) Patent No.: US 7,109,072 B2
(45) Date of Patent: Sep. 19, 2006

(54) SEMICONDUCTOR MATERIAL, FIELD EFFECT TRANSISTOR AND MANUFACTURING METHOD THEREOF

(75) Inventors: Shinichi Saito, Kawasaki (JP); Tadashi Arai, Kumagaya (JP); Seong-Kee Park, Tokorozawa (JP); Toshiyuki Mine, Fussa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/072,414

(22) Filed: Mar. 7, 2005

(65) Prior Publication Data

US 2006/0088960 A1   Apr. 27, 2006

(30) Foreign Application Priority Data

Oct. 27, 2004   (JP)   ............... 2004-311719

(51) Int. Cl.
*H01L 21/00* (2006.01)
*H01L 21/84* (2006.01)

(52) U.S. Cl. ............... 438/149; 438/403; 438/412; 438/479; 257/E21.297; 257/E21.561; 977/723; 977/762; 977/932; 977/937

(58) Field of Classification Search ............ 438/149, 438/403, 411, 479; 257/E21.09, E21.297, 257/E21.461, E21.561; 977/723, 762, 932, 977/937
See application file for complete search history.

(56) References Cited

U.S. PATENT DOCUMENTS 5,438,015 A * 8/1995 Lur .................. 438/407
5,466,630 A * 11/1995 Lur .................. 438/407
2004/0005747 A1   1/2004 Park et al.
2005/0006671 A1 * 1/2005 Heath et al. ............ 257/211

FOREIGN PATENT DOCUMENTS

JP   2004-39765   2/2004

OTHER PUBLICATIONS

2003 Nature Publishing Group pp. 274-278. vol. 425 Sep. 18, 2003.
Applied Physics Letters, vol. 84, No. 26., 5398-5400.

* cited by examiner

*Primary Examiner*—Michelle Estrada
(74) *Attorney, Agent, or Firm*—Mattingly, Stanger, Malur & Brundidge, P.C.

(57) ABSTRACT

The silicon wires formed around metal particles by crystal growth have the problem of metal pollution. For its solution, in the present invention, a silicon bridge is formed through standard silicon processes such as the lithography and the wet etching using hydrofluoric acid performed to an SOI substrate. Thereafter, a thermal oxide film is desirably formed at a high temperature to form a high-quality gate insulating film. It is also desirable to form a coaxial gate electrode. Then, after burying the bridge sections of the silicon bridge in a resist film, the silicon on the bridge girders is removed, and thereafter, the silicon wires buried in the resist film are collected. In this manner, the silicon wires can be collected without dispersing into the hydrofluoric acid solution. Then, a transistor using the silicon wires as a channel is formed.

4 Claims, 34 Drawing Sheets

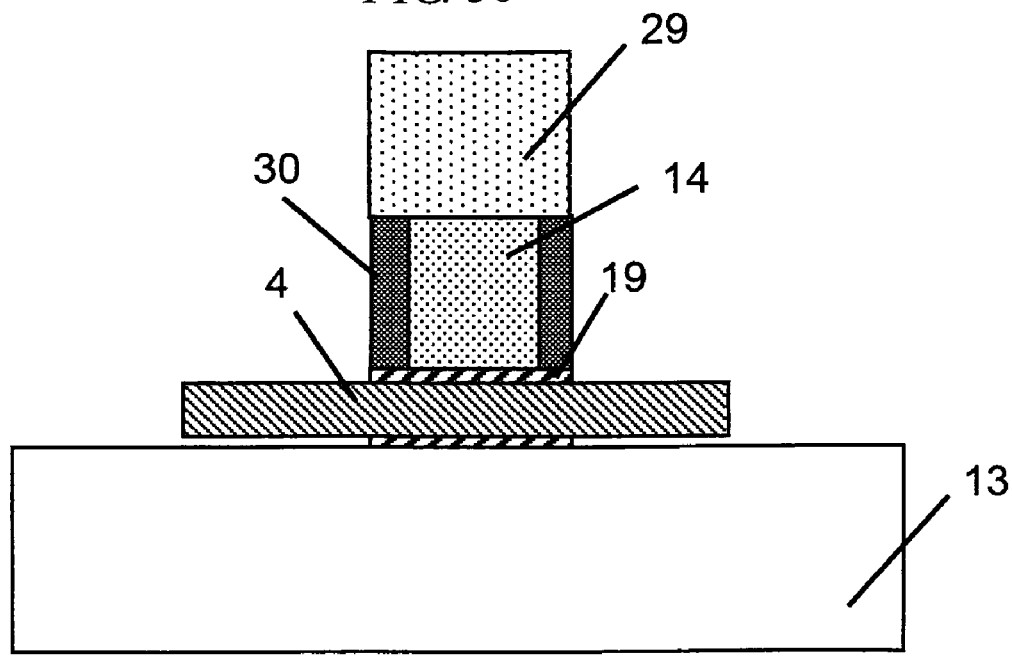
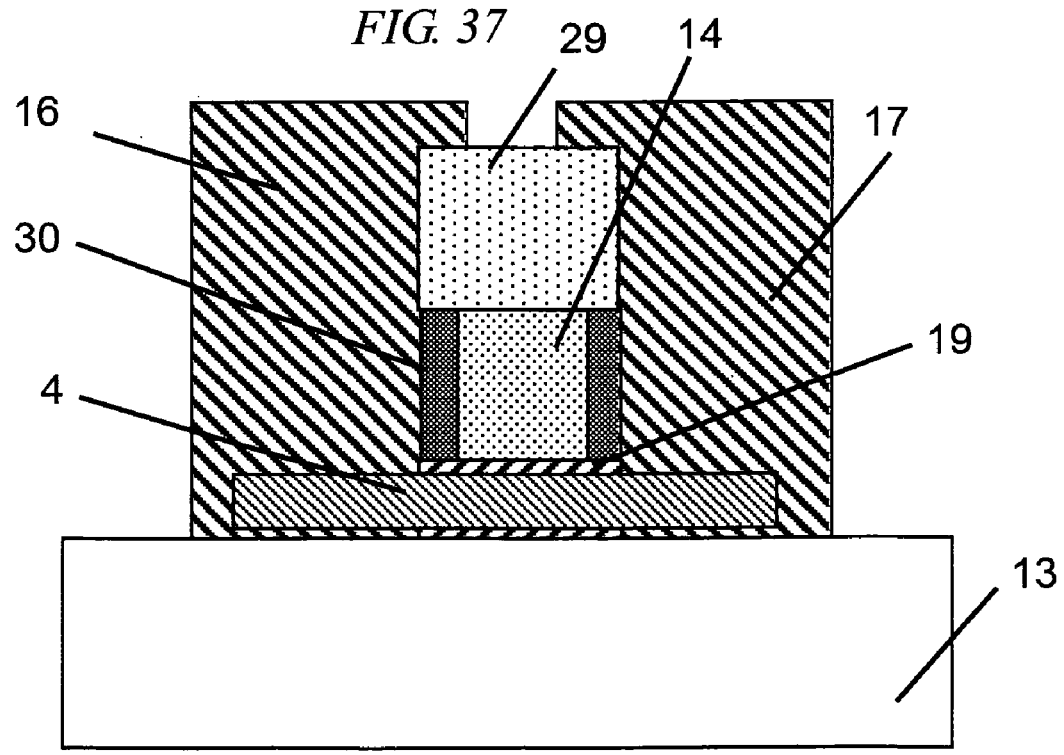

SEMICONDUCTOR MATERIAL, FIELD EFFECT TRANSISTOR AND MANUFACTURING METHOD THEREOF

CROSS-REFERENCE TO RELATED APPLICATION

The present application claims priority from Japanese Patent Application JP 2004-311719 filed on Oct. 27, 2004, the content of which is hereby incorporated by reference into this application.

TECHNICAL FIELD OF THE INVENTION

The present invention relates to a field effect transistor and a manufacturing method thereof. More particularly, it relates to a field effect transistor which can be fabricated on an intended substrate such as a flexible plastic substrate because a wire-shaped semiconductor is used for the channel material and a manufacturing method thereof, and it also relates to the wire-shaped semiconductor and a manufacturing method thereof.

BACKGROUND OF THE INVENTION

In the modern information society, the semiconductor is used in all sorts of things. For example, not to speak of the personal computer and the mobile phone, the semiconductor is used in all of digital consumer electronics such as the flat panel display, the HDD DVD recorder, and the digital video camera. As described above, the trend toward the so-called ubiquitous society in which the information processing spreads to all parts of our society beyond the old framework knows no bounds, and this trend will be further accelerated in the future. As the technology serving as the basis thereof, the mere development of the software is insufficient, and the development of new device technology suitable for the various using environments is indispensable more than ever. For example, for the achievement of the electronic paper which can be flexibly bent like a newspaper and a book, a new technology quite different from the conventional one, that is, the technology for fabricating a transistor on a plastic substrate is required. In another example, in order to perform inventory management of all commodities and to calculate the price of many purchased goods in a moment in a supermarket or the like, it is necessary to fabricate a large amount of the RF-ID (Radio-Frequency Identification) tags capable of transmitting the information through radio waves at low cost.

In addition, in another example, in order to realize a display fabricated on the whole area of the wall, a method for forming transistors on a large area by using a printing technology is required. If this can be realized, the sense of reality as if traveling all over the world is no longer a fantasy even at home. Also, the wearable transistor which can be flexibly bent and can wear well against water and wind is indispensable for fabricating the audio player on the clothes. If the wearable transistors can be highly integrated at low cost, for example, the T-shirt having a moving image thereon is realized. Further, the transistors are embedded not only in the clothes but also in the eyeglasses and ultimately in the contact lenses so as to display the information images thereon. As described above, the transistors which can be integrated on an intended substrate and on a wall are called the flexible transistors. The flexible transistor is expected to be applied to the entirely new field as described above.

The organic transistor is a representative of the flexible transistor. The organic transistor is a field effect transistor in which an organic material such as polythiophene and pentacene is used as the channel material. The organic transistors can be fabricated on a plastic substrate by a printing method such as the inkjet printer and the roll-to-roll printing using the organic semiconductor in a solution state.

However, the performance of the organic semiconductor required in the expected application field is difficult to be achieved due to its low mobility. Although the mobility of the organic semiconductor is remarkably increased owing to the advancement in the material development in recent years, even the single crystal pentacene fabricated by the deposition method has the mobility of only about 1 $cm^2/Vs$. In addition, when forming it by the deposition method, the organic semiconductor is adhered on the whole substrate surface, and the device isolation becomes difficult. Therefore, the deposition method is not suitable for the method of forming the transistors on a flexible plastic substrate. The transistors formed by a printing method which is more suitable than the deposition method is also under development. However, in the case of the printing method, since the single crystallization of the organic semiconductor is difficult, the mobility is reduced by one or two orders of magnitude and is about 0.1 $cm^2/Vs$ at most. On the other hand, when the organic EL (Electro-Luminescence) material is used as the display element of the electronic paper, the mobility of about 10 $cm^2/Vs$ is required. Also, the mobility of about 10 $cm^2/Vs$ is required even in the case where the frequency of about 13.56 MHz band is used for the RF-ID tag. Therefore, it is difficult to satisfy the required performance in the expected application field by the mobility of the organic semiconductor.

The low mobility of the organic semiconductor is derived from the basic characteristics of the material. More specifically, since the coupling between the carrier (the electron or the hole) and the phonon (the lattice vibration) is strong in the organic semiconductor and the carriers are strongly scattered, the mobility is low. In addition, the strong mutual coupling between the electron (hole) and lattice forms a quasiparticle such as polaron and bipolaron and the effective mass of the carriers is increased. As a result, the mobility is decreased due to the increase of the effective mass. This is fundamentally related to the fact that the heavy mass is difficult to move. Therefore, the solution of the problem is difficult. Consequently, even if the organic semiconductor in a single crystal state is formed, the mobility of about 10 $cm^2/Vs$ is very difficult to be achieved. Furthermore, the single crystal state is an ideal state and the single crystallization of the entire organic semiconductor is difficult when practically using the organic semiconductor. In the amorphous state and the polycrystalline state other than the single crystal state, the large resistance is caused when the carriers passes through the grain boundary. Therefore, the mobility is lower than that of the single crystal state. This is the common problem in the semiconductor fabricated by the various deposition method and solution method. For example, polycrystalline Si is used for the transistor which is used for driving the liquid crystal display, and the mobility of the polycrystalline Si is one order of magnitude lower than the mobility of single crystal Si used for the LSI. As described above, since the mobility of the organic semiconductor is low due to the unique characteristics of the material and the fabrication method, it is difficult to practically use the organic semiconductor. The organic semiconductor has not only the problem of the lower mobility but also the problem of low reliability, that is, the device characteristics are rapidly degraded in the air. In view of the current situation of the organic semiconductor and the expectation for the flexible transistor, the attempt to realize the flexible transistor by using the inorganic semiconductor as the channel material without using the organic semiconductor has been made.

As a representative example, the fabrication of a polycrystalline silicon chip by the transfer method is known. In this method, the chip in which the transistors using polycrystalline silicon as a channel material are integrated is fabricated on a glass substrate, and then, the chip is separated from the glass substrate and attached to a plastic substrate. According to this transfer method, the same performance as the transistor using the polycrystalline silicon fabricated on the glass substrate can be realized by a chip fabricated on the plastic substrate. When integrating the elements on a flexible plastic substrate, the temperature cannot be increased so high. However, in this transfer method, since the polycrystalline silicon transistor can be fabricated on the glass substrate, a relatively high-temperature process of about 500° C. can be used. As a result, the channel mobility of the transistor of about 10 $cm^2/Vs$ can be achieved. However, in the operation for fabricating the polycrystalline silicon transistor on the glass substrate, since the step using lithography is performed many times, the process cost is very high. The increase of the process cost is fatal problem from the viewpoint of the application to the flexible transistor.

For example, for the full-scale spread of the electronic paper, it is necessary to fabricate the electronic paper at the low cost equal to that of the paper. Also, the devices for the RF-ID tags must be fabricated by the process at low cost enough to be disposable. Therefore, the flexible transistors are preferably fabricated by the printing method not by the transfer method. In addition, in the application to a large area, that is, in the case of forming a display device on a whole area of a wall, since there is the limitation in the transfer method in which the transistors are formed on a glass substrate, it is quite difficult to form a display device on a whole area of a wall by the transfer method. As described above, the polycrystalline silicon chip on the plastic substrate by the transfer method is superior to the organic semiconductor in performance. However, it cannot sufficiently satisfy the requirements for the flexible transistor in terms of the cost and the area enlargement. Further, since it uses the polycrystalline silicon, the performance equal to that of the LSI using the single crystal silicon cannot be achieved.

As another method of using the inorganic semiconductor, the method of using a silicon nanowire as a channel material is known. In Nature vol. 425, p. 274 (2003), the field effect transistor using the silicon nanowire on the plastic substrate is disclosed. The silicon nanowire indicates the wire-shaped single crystal silicon with a diameter of several nm to several tens nm and a length of several tens μm or more. The silicon nanowire can be dispersed into a solution by using the surface active agent. As a result, the field effect transistors using the silicon nanowire can be integrated on the plastic substrate by the printing method. Since the crystal structure of the silicon nanowire is the single crystal, the channel mobility of the field effect transistor using the silicon nanowire is about 100 $cm^2/Vs$ which is almost equal to that of the single crystal silicon used in the standard LSI. Therefore, the field effect transistor using the silicon nanowire can achieve the high mobility required in the flexible transistor expected for various applications, and thus, it can be said that the field effect transistor using the silicon nanowire is a quite promising device. In addition, for the practical application of the field effect transistor using the silicon nanowire, the knowledge of the silicon transistor developed in the conventional LSI can be utilized for the new application of the flexible transistor.

The silicon nanowire has the other advantages as follows. As is well known in the art, although the silicon substrate used in the standard LSI has a thickness of at least about 500 μm, the region effectively used as the channel of the transistor is at most 100 nm or less, and only the region of several nm from the substrate surface is used as the channel inversion layer. In other words, most silicon substrate is used as a mere supporting substrate. If the silicon layer necessary for forming the channel is about 5 nm, the region effectively used is only one-hundred thousandth. Meanwhile, in the case of the silicon nanowire, the flexible plastic substrate can be used for the supporting substrate, and the silicon necessary for forming the channel is effectively utilized in the transistor using the silicon nanowire with a diameter of several nm to several tens nm. Therefore, it can be said that the transistor using the silicon nanowire is an attractive device in terms of the effective use of the resource.

For fabricating the silicon nanowire, the method of making full use of the nano technology is used. First, metal nanoparticles such as gold and silver with a diameter of about several nm are prepared, and a sample in which the nanoparticles are dispersed on a substrate such as glass is prepared. Next, when the sample is placed in the atmosphere of monosilane gas by using the chemical vapor deposition method, the single crystal silicon nanowire is grown around the metal nanoparticles. As described above, the nanometer scale material, for example, the silicon nanowire can be collected from the chemical reaction at the atomic and molecular level by using the so-called bottom-up process. Since macro devices such as the transistor and the integrated circuit are assembled eventually, the transistor using the silicon nanowire can be regarded as the combination of the bottom-up process and the top-down process.

The above-described field effect transistor using the nanowire structure is not limited to that using silicon as the nanowire material. Actually, even in the case where the nanowire made of germanium or compound semiconductor such as InP is used as the channel material, the field effect transistor can be operated similarly to the case of using the silicon nanowire. Also, the one-dimensional wire structure made of inorganic material is not always necessary. For example, the mobility of the transistor is high also in the case where the carbon nanotube which is a pure organic material is used as the channel material. If a large amount of high-quality carbon nanotube can be obtained in the future, the flexible device using the carbon nanotube can be fabricated in the same process as that of the silicon nanowire.

Also, the wire structure is not always required to have the nanometer scale diameter, and it is also preferable to use the top-down process without using the bottom-up process. Applied Physics Letter, Vol. 84, p. 5398 (2004) discloses the method of forming the silicon wire, in which a silicon layer of an SOI (Silicon-On-Insulator) substrate is processed into a wire shape with a width of several μm and length of several tens μm by using the lithography, and then, $SiO_2$ of the BOX layer is removed by using hydrofluoric acid so as to lift-off the silicon wire. The silicon wires fabricated in the top-down process as described above are wider than the silicon nanowires fabricated in the bottom-up process in many cases. However, the channel mobility is determined based on the wire material and the wire crystallinity and not dependent on the wire width. Therefore, the sufficient performance as the flexible device can be achieved in both cases.

SUMMARY OF THE INVENTION

As described above, the transistor using the silicon wire as a channel material (hereinafter, referred to as silicon wire transistor) is quite promising for the application to the flexible device. However, there are a lot of problems to be solved for the practical use of the silicon wire transistor.

The problem in the formation of the silicon nanowire by the bottom-up process using the metal nanoparticles is the metal pollution. As is well known in the art, it is necessary to strictly control the pollution in the silicon process. This is because the characteristics of the field effect transistor using silicon are determined depending on the impurity concentration and the variation of the impurity concentration directly causes the variation in the device characteristics. The variation in the device characteristics directly influences the yield. However, the heavy metal pollution occurs since the silicon nanowires are formed around the metal nanoparticles. Particularly, since heavy metal such as gold rapidly disperses into silicon, the mass production of the silicon wire transistor is difficult when the silicon nanowires polluted by the heavy metal are used in the fabrication process. Therefore, it is necessary to solve the problem of the metal pollution for the practical use of the silicon wire transistor.

In addition, in the bottom-up process using the metal nanoparticles described above, the silicon nanowires are probabilistically formed around the metal nanoparticles by the crystal growth. Therefore, the width and the length of the silicon nanowires are not uniform. For the integration of several millions to several tens millions of transistors using the silicon nanowires, it is necessary to reduce the variation in device characteristics. Therefore, it is obviously desirable that the silicon nanowires have the uniform shape.

In the above-described process using the lift-off by hydrofluoric acid after processing the SOI substrate by the lithography, the problems of the metal contamination and the variation of the wire shape can be solved. This is because the metal pollution does not occur when the SOI substrate is processed in a clean room and the wire shape can be accurately formed within the range of the process accuracy when it is processed by the usual silicon process using the lithography. Therefore, under the present situation, the silicon wire with a diameter of several μm to sub μm formed by the top-down process is more preferable than the silicon nanowire formed by the bottom-up process from the view point of the integration.

However, when using the lift-off by hydrofluoric acid, it is difficult directly collect the silicon wires dispersed in the hydrofluoric acid solution. The silicon wires can be collected by means of substitution for solutions such as water. However, the collection rate of the silicon wires is reduced due to the process of the substitution. Furthermore, since it is necessary to make a dilution many times so as to remove the hydrofluoric acid in the process of the substitution, the collection rate of the silicon wires is extremely reduced. Also, the method using the filtration may be available. However, the new filter for filtering the silicon nanowires from the hydrofluoric acid is required. Further, when the silicon wires are arranged on a substrate such as a glass substrate which is dissolved by hydrofluoric acid and the hydrofluoric acid is not completely removed by the substitution, the glass substrate may be damaged by the hydrofluoric acid.

Furthermore, the lift-off by hydrofluoric acid has a problem that the $SiO_2$ around the silicon wires is all removed. As is well known in the field of silicon technology, one of the reasons why silicon is extremely successfully applied to the LSI is that $SiO_2$ which functions as a high-quality insulating film can be formed by the high-temperature oxidizing atmosphere. $SiO_2$ on the surface of the silicon has extremely high performance as the gate insulating film of the field effect transistor. In this case, the high performance means the small fixed charge, the low interface state, and the large band offset of the valence band and the conduction band with silicon. In the field of LSI, the research for using a high dielectric constant gate insulating film with the dielectric constant higher than that of the $SiO_2$ instead of the gate insulating film made of $SiO_2$ has been made. However, even in such a case, an extremely thin $SiO_2$ film called an interface layer is indispensable on the surface of silicon in order to reduce the defect density in the gate insulating film. Since the $SiO_2$ is all removed in the lift-off by hydrofluoric acid, the high-quality $SiO_2$ cannot be used as the gate insulating film. The method in which after the lift-off of the silicon wires by hydrofluoric acid, the silicon wires are oxidized on the plastic substrate may be available. However, in this case, since the temperature cannot be increased to higher than 400° C. even if a heat-resistant plastic substrate is used, it is impossible to form a high-quality gate insulating film. In order to use the high-quality gate insulating film, it is necessary to form the $SiO_2$ obtained by the thermal oxidation of the surface of the silicon wires at a high temperature of about 1000° C. However, when the silicon wires are collected by the lift-off by hydrofluoric acid, the high-quality $SiO_2$ as described above cannot be used.

Also, the above-described manufacturing method of the silicon wires using the SOI substrate has the problem of high cost. The SOI substrate is far more expensive than the normal silicon substrate. As described above, in order to achieve the application to the flexible transistor, it is indispensable to fabricate the device by a low-cost process such as the printing process. In consideration of the problems described above, the first object of the present invention is to provide a manufacturing method of a silicon wire in which the lithography capable of reducing the metal pollution and processing the wires into a desired shape is used and the silicon wires are not dispersed into hydrofluoric acid, a silicon wire transistor using the silicon wire, and a manufacturing method of the silicon wire transistor.

The second object of the present invention is to provide a manufacturing method of a silicon wire in which a thermal oxidation film is formed around silicon wires at high temperature and the silicon wires are collected without removing the thermal oxidation film by hydrofluoric acid, a silicon wire transistor using the silicon wires covered with the thermal oxidation film, and a manufacturing method of the silicon wire transistor. Also, the third object of the present invention is to provide a method for manufacturing the silicon wires by a low-cost process in comparison to the case using an SOI substrate, a silicon wire transistor using the silicon wires, and a manufacturing method of the silicon wire transistor.

A representative example of the present invention will be described as follows. That is, it is a manufacturing method of a field effect transistor, which comprises the steps of: (a) preparing an SOI substrate having a first substrate, an insulating film formed on the first substrate, and a semiconductor layer formed on the insulating film; (b) processing the semiconductor layer into semiconductor pieces; (c) partly removing the insulating film below the semiconductor pieces; (d) forming an organic material film which partly covers an upper surface and a lower surface of the semiconductor pieces located in a region where the insulating film has been removed in the step (c) and covers a surface of the first substrate; (e) separating the semiconductor pieces from the insulating film; (f) dissolving the organic material film into organic solvent to separate the semiconductor pieces from the first substrate, and then, collecting the semiconductor pieces; and (g) forming a field effect transistor on a second substrate by using the semiconductor pieces.

As the representative effects of the present invention, a high-quality semiconductor material can be provided, and a good flexible device can be provided.

BRIEF DESCRIPTIONS OF THE DRAWINGS

FIG. 36 is a cross-sectional view showing the manufacturing process of the transistor according to the third embodiment of the present invention;

FIG. 37 is a cross-sectional view showing the completed transistor according to the third embodiment of the present invention;

DESCRIPTIONS OF THE PREFERRED EMBODIMENTS

Figure 1:
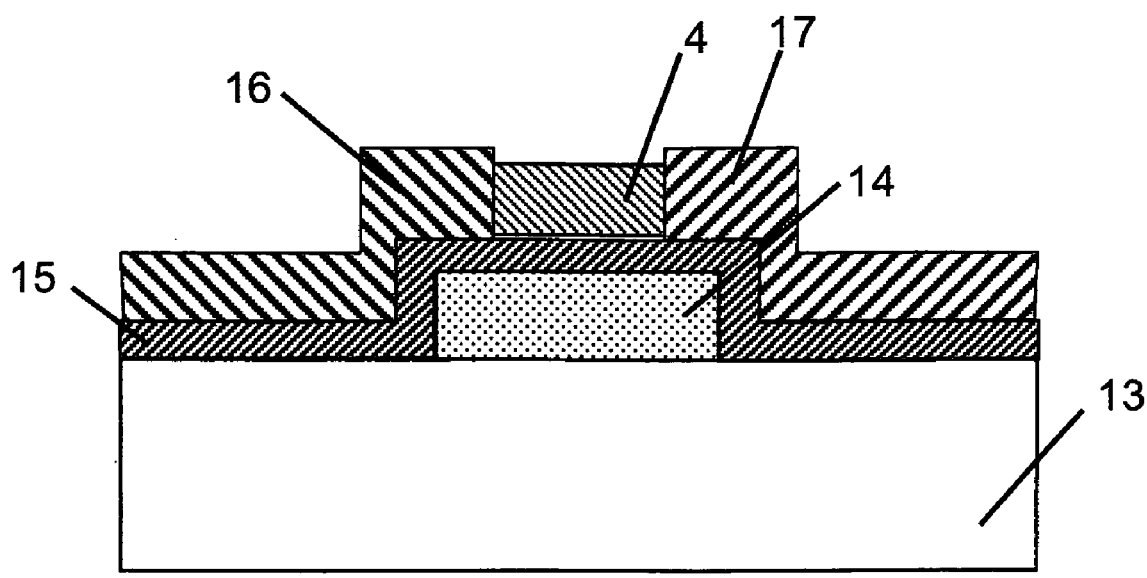
FIG. 1 is a cross-sectional view of the completed semiconductor device according to the first embodiment of the present invention.

Hereinafter, embodiments of the present invention will be described in detail. The embodiments will be described with reference to the drawings so as to make the description easily understood, and the principal parts are enlarged in the drawings. It goes without saying that the material, the conductivity type, and the manufacturing conditions of each component are not limited to those described in the embodiments and various modifications can be made within the scope of the present invention. Note that the semiconductor piece in this specification indicates the pillar-shaped semiconductor formed by processing the semiconductor unless otherwise stated. Particularly, when silicon is used for the semiconductor, the pillar-shaped semiconductor is called silicon wire.

First Embodiment

In this embodiment, a method of manufacturing a semiconductor material in which a bridge structure is formed so as to collect the silicon wires without using the lift-off of the silicon wires in the hydrofluoric acid solution and a method of forming a flexible transistor using the silicon wires will be disclosed.

Figure 2:
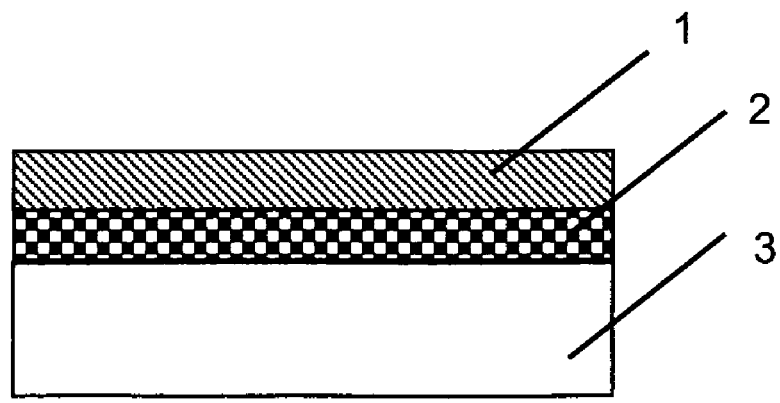
FIG. 2 is a cross-sectional view of an SOI (Silicon-On-Insulator) substrate.

First, an SOI (Silicon-On-Insulator) substrate comprised of a silicon layer 1, an oxide film 2, and a silicon substrate 3 as shown in FIG. 2 is prepared. In the SOI substrate, the silicon layer 1 is made of single crystal silicon. The size of the SOI substrate is 8 inches, the thickness of the silicon layer 1 is 200 nm, the thickness of the oxide film 2 serving as a BOX layer is 200 nm, and the thickness of the silicon substrate 3 is 500 µm. In order to reduce the contact resistance with electrodes, the doping is performed to the silicon layer. Boron is implanted into the silicon wire operated as a p type storage transistor until its concentration reaches $1 \times 10^{17}$ cm$^{-3}$, and the activation annealing process is performed. By doing so, the silicon wire is doped to p type. On the other hand, phosphorus is implanted into the silicon wire operated as an n type storage transistor until its concentration reaches $1 \times 10^{17}$ cm$^{-3}$, and the activation annealing process is performed. By doing so, the silicon wire is doped to n type. In this embodiment, the silicon layer 1 doped to p type and the silicon layer 1 doped to n type are described with no distinction. However, since the silicon wires doped to the respective conductivity types are of different wafers, both of them are separated during the manufacturing process, and the semiconductor material and the transistor using the silicon wires can be fabricated even when the doping to either conductivity type is performed.

Figure 3:
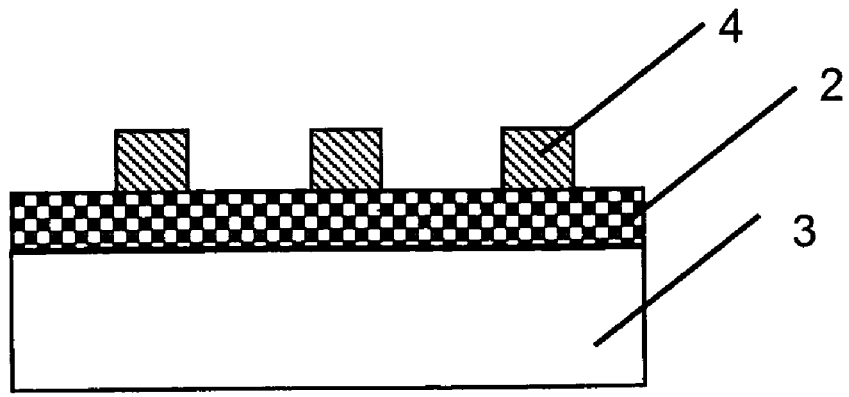
FIG. 3 is a cross-sectional view showing patterned silicon on the substrate.
Figure 4:
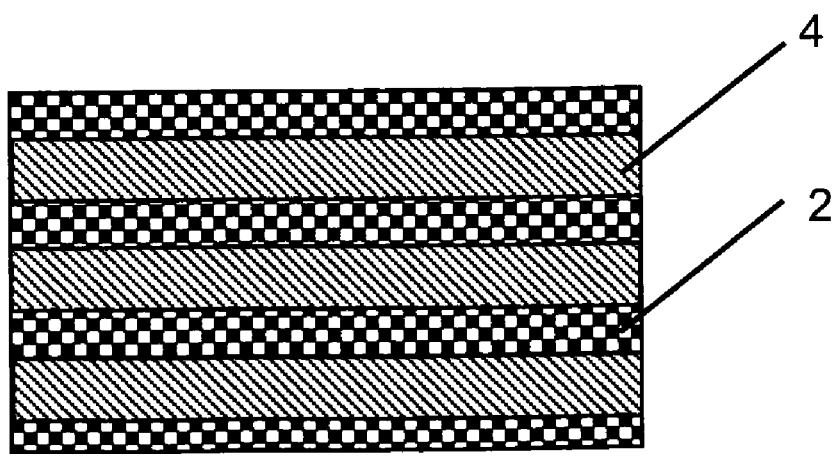
FIG. 4 is a schematic diagram of the patterned silicon seen from above the substrate.

Next, after coating a resist on the silicon layer, the patterning of the resist film by the lithography and the dry etching of the silicon layer 1 are performed. Thereafter, the resist film is removed. In this manner, strip-shaped semiconductor pieces with the width of 200 nm and at an interval of 400 nm, that is, silicon wires 4 are formed. FIG. 3 is a cross-sectional view of the silicon patterned on the substrate, and FIG. 4 is a schematic diagram of the patterned silicon seen from above the substrate. The reason why the silicon is patterned into the stripe shape as described above is that a large number of silicon wires can be efficiently formed from the viewpoint of mass production in comparison to the case of forming the silicon wires in random directions. Further, it is more preferable that the intervals between the adjacent wiring wires are set equal to the minimum processing dimensions of the lithography. By doing so, a larger number of silicon wires can be formed.

Figure 5:
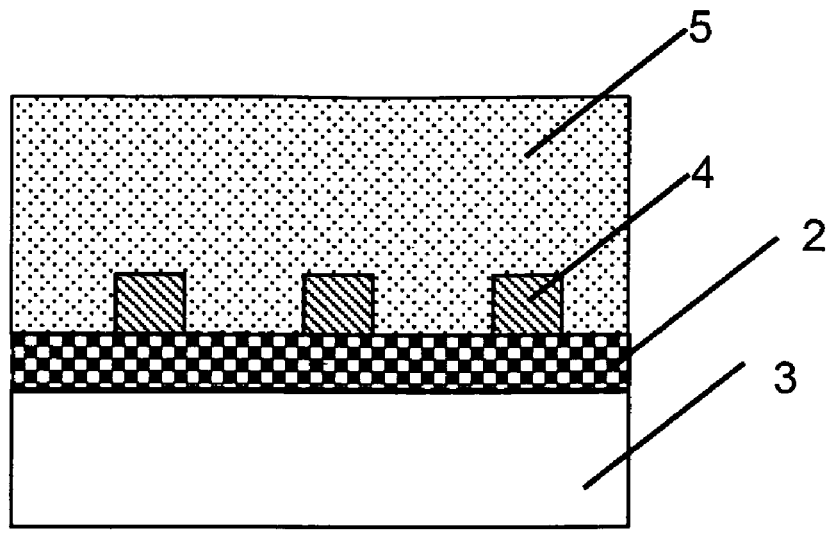
FIG. 5 is a cross-sectional view showing the silicon buried in a resist.
Figure 6:
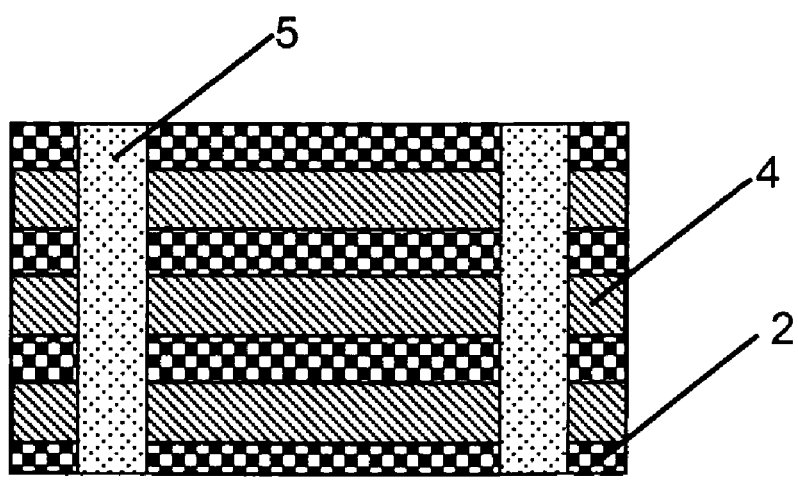
FIG. 6 is a schematic diagram of the patterned silicon seen from above the substrate.

Subsequently, after coating a resist film 5 on the whole surface, the resist film 5 is processed and left only on the desired regions. By doing so, the structure in which the silicon wires 4 are partly buried in the resist film 5 is formed as shown in the cross-sectional view of FIG. 5. FIG. 6 is a schematic diagram showing the patterned resist film 5 and the silicon wires 4 seen from above the substrate. The thickness of the resist film 5 is 1 μm and the width and the length thereof are 10 μm and 0.5 cm, respectively. In this case, the width of the resist film 5 must be larger than the thickness of the oxide film 2 which is partly removed by the wet etching. Also, since the length of the silicon wire 4 acquired finally is shorter than the length between the adjacent resist films 5, the length between the adjacent resist films 5 needs to be controlled so that the silicon wire 4 has a desired length. In this embodiment, the length between the adjacent resist films 5 is 100 μm. In addition, the resist film 5 is formed over a plurality of silicon wires and extends in a direction vertical to the direction of the silicon wires.

Figure 7:
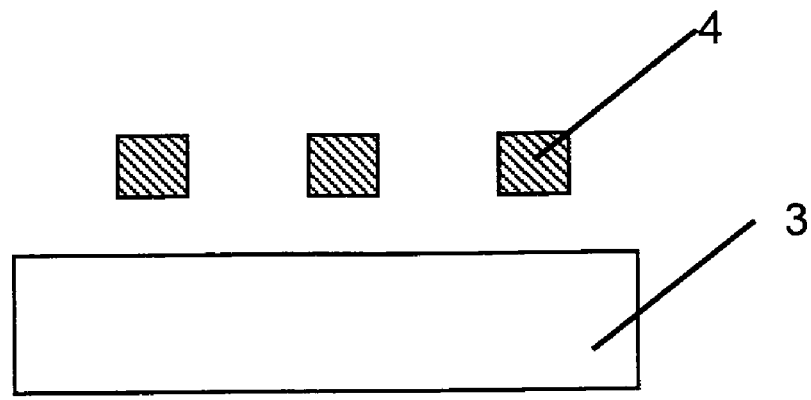
FIG. 7 is a cross-sectional view of the silicon processed into a bridge structure by the wet etching.
Figure 8:
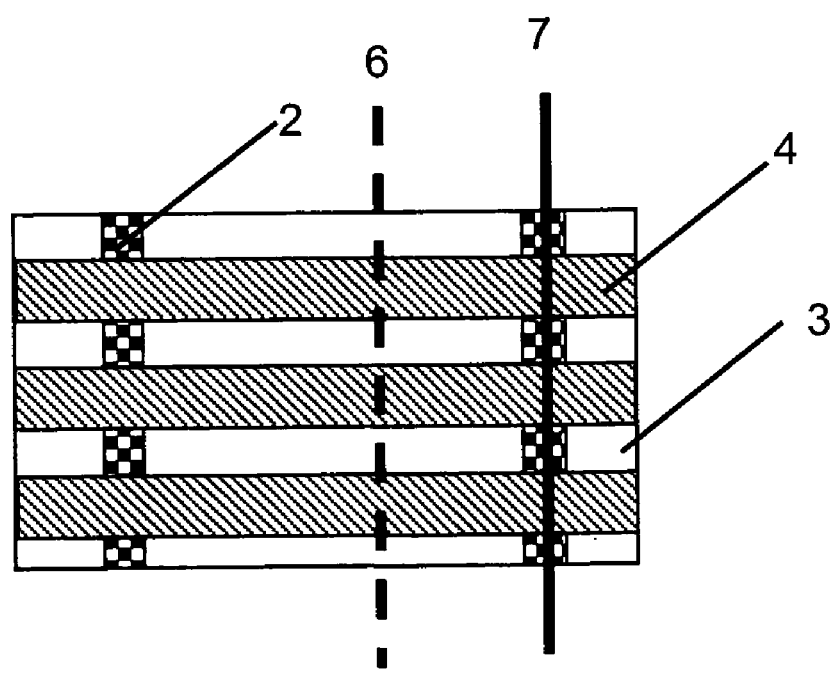
FIG. 8 is a diagram of the silicon processed into a bridge structure by the wet etching seen from above the substrate.

The oxide film 2 below the silicon wires 4 is partly removed by the wet etching using hydrofluoric acid with using the processed resist pattern as a mask, thereby forming the bridge structure (hereinafter, also referred to as silicon bridge). Thereafter, the resist film 5 is removed. FIG. 8 shows the state at this time seen from above the substrate. This bridge structure is comprised of oxide films 2 serving as bridge girders and the silicon wires 4 processed into stripe shape serving as a bridge section. In other words, this bridge structure is comprised of the silicon wires 4 which are the supported parts and the oxide films 2 which are the supporting parts. Also, the oxide films 2 are oxide films common to the plurality of silicon wires (semiconductor pieces) and are formed in a direction vertical to the extending direction of the silicon wires. FIG. 7 is a cross-sectional view taken along the dotted line 6 in FIG. 8. FIG. 7 shows the state where the silicon wires which are the supported parts of the bridge structure are floating in the air. On the other hand, FIG. 3 is a cross-sectional view taken along the line 7 in FIG. 8. More specifically, the oxide film 2 shown in FIG. 3 is not influenced by the wet etching using hydrofluoric acid because it is covered with the resist, and the oxide film 2 serves as the bridge girder for supporting the silicon wires of the bridge structure.

Figure 9:
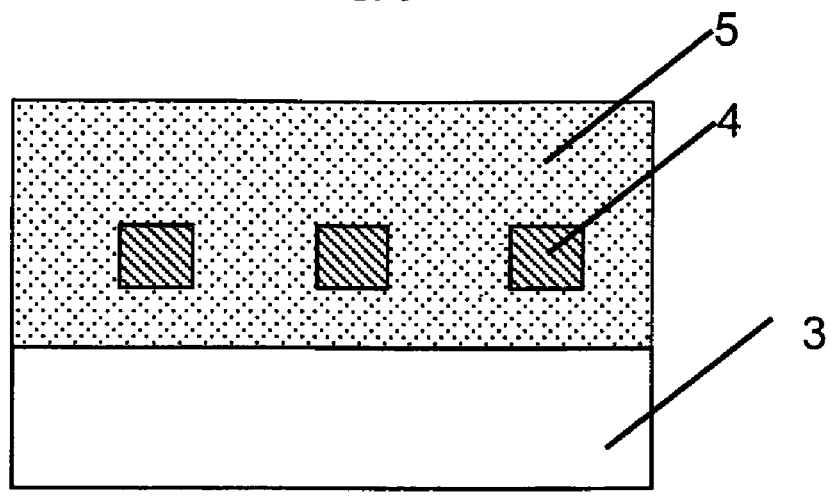
FIG. 9 is a cross-sectional view showing the silicon wires buried in a resist.
Figure 10:
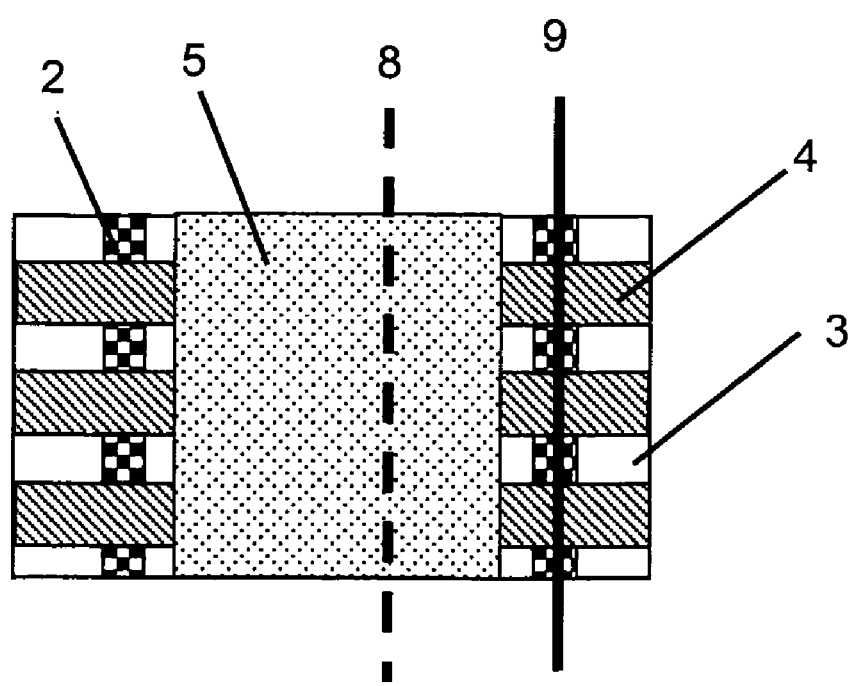
FIG. 10 is a diagram of the silicon wires buried in the resist seen from above the substrate.

Subsequently, after coating an organic material such as the resist 5 on the whole surface, the resist film 5 (organic material film) is processed and left only on the desired region. By doing so, the structure of FIG. 10 seen from above the substrate is formed, in which the central parts of the bridge sections, that is, the silicon wires 4 of the bridge structure are covered with the resist film 5 and the bridge girders are not covered with the resist film 5. In other words, the resist film 5 partly covers the upper surface and the lower surface of the silicon wires and the surface of the silicon substrate 3 in the region where the silicon oxide 2 has been removed. In this case, the resist covering the upper surface of the silicon wires is used as an etching mask in the latter process and the resist covering the lower surface of the silicon wires has a function to bond the silicon substrate 3 and the silicon wires. Also, a positive type resist which can be dissolved by organic solvent when collecting the silicon wires 4 is used as the resist 5. The cross-sectional view taken along the line 9 in FIG. 10 is shown in FIG. 3, in which the resist 5 is not provided. Also, the cross-sectional view taken along the dotted line 8 in FIG. 10 is shown in FIG. 9, in which the silicon wires 4 serving as bridge sections correspond to the parts covered with the resist 5.

Figure 11:
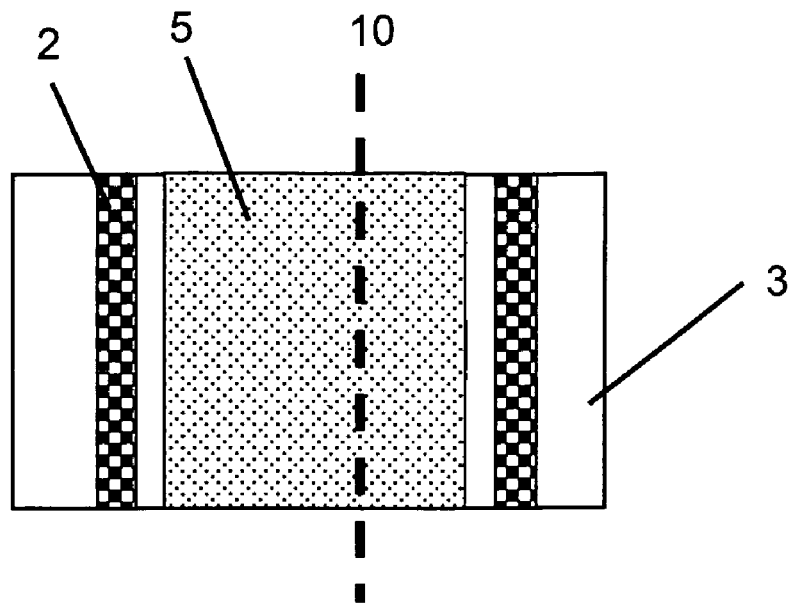
FIG. 11 is a diagram of the silicon wires buried in the resist seen from above the substrate, showing the state after removing the bridge girders by the wet etching.

Subsequently, the silicon wires 4 on the bridge girders not covered with the resist 5 in FIG. 10 are removed by the dry etching. By doing so, the state where the silicon wires 4 are buried in the resist can be achieved as shown in FIG. 11. In this case, the cross-sectional view taken along the dotted line 10 in FIG. 11 corresponds to FIG. 9. In this process, the separation between the silicon wires 4 and the oxide film 2 is required. Therefore, either of the silicon wires or the oxide film at the junction portion where the silicon wires and the oxide film are connected may be removed. However, when the silicon wires are removed, the silicon wires covered with the resist film 5 are left. Therefore, it is possible to obtain the silicon wires (semiconductor pieces) with a desired length.

Figure 12:
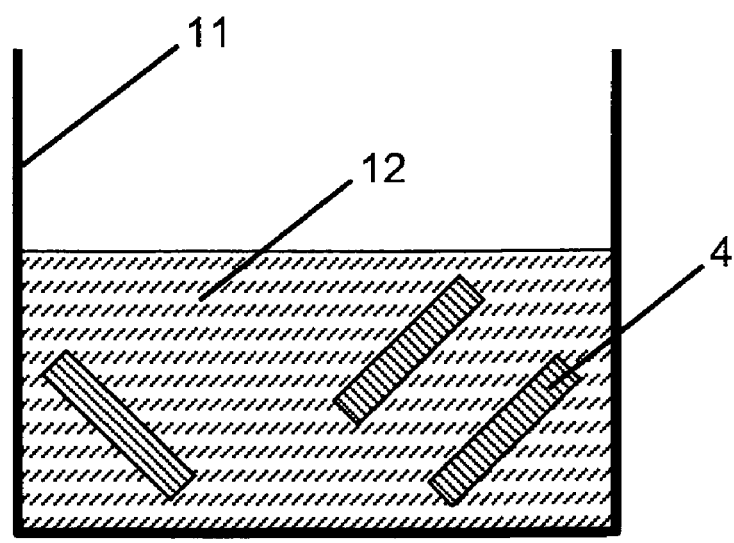
FIG. 12 is a schematic diagram of the silicon wires dispersed into organic solvent.

Subsequently, the entire wafer is placed in a beaker 11 of organic solvent 12 which dissolves the resist 5. By doing so, the resist below the silicon wires is dissolved and the silicon substrate 3 and the silicon wires 4 are separated. Then, the silicon wires 4 are dispersed in the organic solvent 12 as shown in FIG. 12. In this embodiment, tetrahydrofuran (THF) is used as the organic solvent 12, and acetone is also available. In this manner, the silicon wires 4 can be collected without dispersing into hydrofluoric acid. In the process described so far, the silicon wires formed by processing an SOI substrate, that is, the semiconductor material can be formed.

Next, the silicon wire formed in this embodiment will be described. As is understood from the description above, the silicon wire is a pillar-shaped semiconductor extending in a direction and has a rectangular-pillar shape. More specifically, when the surface vertical to the extending direction of the silicon wire is defined as a bottom surface, the silicon wire is a rectangular-pillar whose bottom surface has a width of 200 nm and a length of 200 nm and whose height is 100 μm. Hereinafter, the height direction when the smallest surface of the surfaces of the silicon wire is defined as a bottom surface is referred to as an axial direction of the silicon wire.

The shape of the silicon wire is not limited to the pillar shape, and the columnar shape and the sub-rectangular shape are also available. Also, not only the flat surface but also the curved surface is available as the bottom surface. Now, the significantly important thing will be described in terms of the cost. After the removal of the silicon wires 4, only the patterned oxide film 2 is left on some parts of the silicon substrate 3. Since the oxide film 2 can be easily removed by the wet etching using hydrofluoric acid, if the planarization process is performed, this silicon substrate 3 can be reused as a substrate for fabricating an SOI substrate by the SIMOX method or the bonding method. Supposing that the surface is polished by 200 nm for the planarization, the number of silicon wires which can be collected from one wafer according to the process described above when the SIMOX method is used will be calculated. If the process from the fabrication of an SOI substrate by the SIMOX method to the collection of the silicon wires is defined as one set, the thickness of the silicon substrate is reduced by about 500 nm after the one set. When the thickness of the silicon substrate is 500 μm, the silicon wires of one thousand sets can be collected from one wafer. If the market price of the 8-inch SOI wafer is one hundred thousand yen, one-thousandth of one hundred thousand yen is one hundred yen. This price is attractive for the practical use of the flexible transistor. Of course, since the calculation above does not consider the process cost for recovering the SOI substrate, the actual cost is probably higher than that. However, the price is within the allowable range when considering the application to the flexible transistor. Further, in the process according to the present invention, a large part of the silicon layer which has been used as a mere supporting substrate in the prior art can be effectively used. Therefore, the transistor using the silicon wire is superior from the viewpoint of the protection of resource and the environment preservation. Next, the method of manufacturing a transistor in which the silicon wire 4 thus fabricated is used as a channel will be described.

Figure 13:
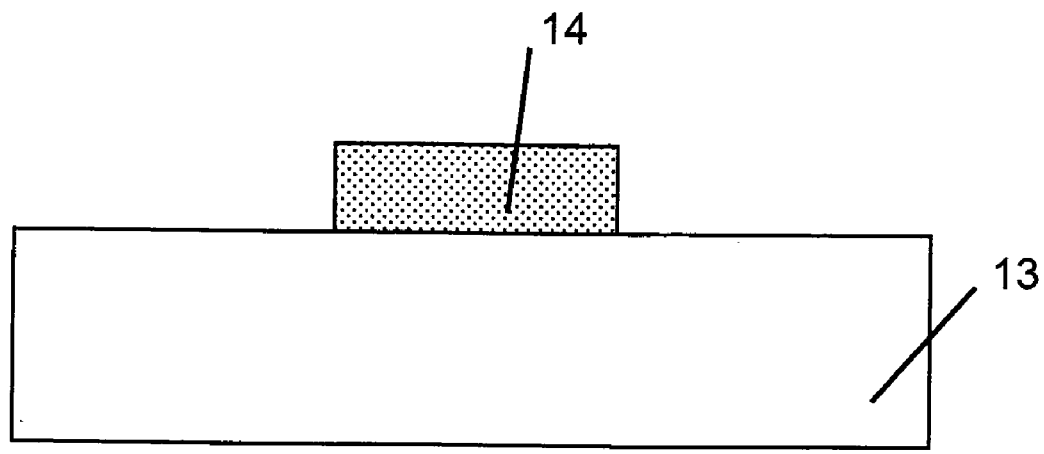
FIG. 13 is a cross-sectional view showing the manufacturing process of the transistor according to the first embodiment of the present invention.
Figure 14:
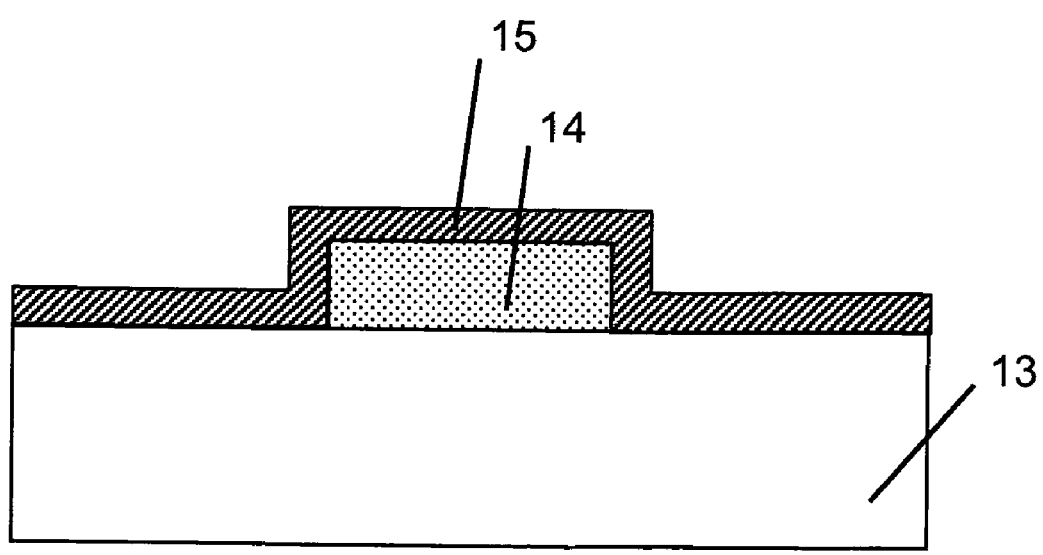
FIG. 14 is a cross-sectional view showing the manufacturing process of the transistor according to the first embodiment of the present invention.

First, a gate electrode 14 is formed by the patterning process on a plastic substrate 13. At this time, if a plurality of transistors are to be integrated, the wiring connected to the gate electrode 14 is preferably formed in advance. This is because the transistors of this embodiment employ the bottom-gate structure, while the transistors used in the standard LSI employ the top-gate structure in which the gate electrode is formed on the channel. It is desirable that a metal material having a work function appropriate for setting the threshold voltage of the transistor to a desired value is used as the gate electrode material. In addition, it is desirable that the printing method using a solution material is used as the method of patterning the gate electrode 14. For example, the nanoparticles of gold and silver become usable as the wiring and the gate electrode 14 when the nanoparticle structure thereof is dissolved by the heat treatment at a high temperature of about 100° C. The material of the gate electrode 14 is not limited to an inorganic material, and a low-resistance organic semiconductor material such as the heavily doped polythiophene is available as the material for forming the gate electrode 14. In this embodiment, Al formed by a vacuum deposition using a stencil mask is used as the gate electrode 14 for the simplification of the process as shown in FIG. 13. Subsequently, a gate insulating film 15 is formed on the whole surface. An organic insulator which can be formed from a solution or an inorganic material can be used as the material of the gate insulating film. In this embodiment, $Al_2O_3$ with a thickness of 20 nm formed by the atomic layer chemical vapor deposition (ALCVD) is used as the gate insulating film 15 as shown in FIG. 14.

Figure 15:
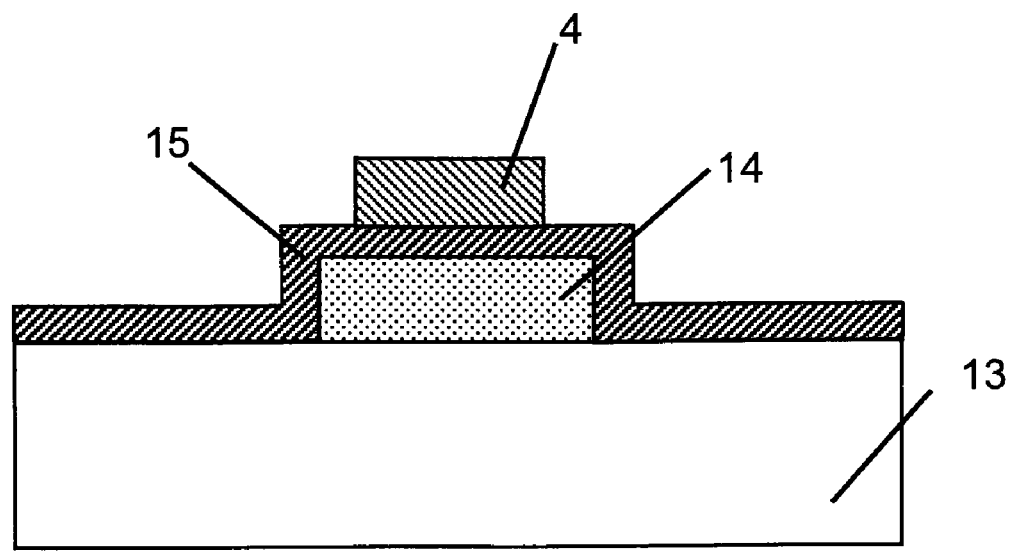
FIG. 15 is a cross-sectional view showing the manufacturing process of the transistor according to the first embodiment of the present invention.
Figure 16:
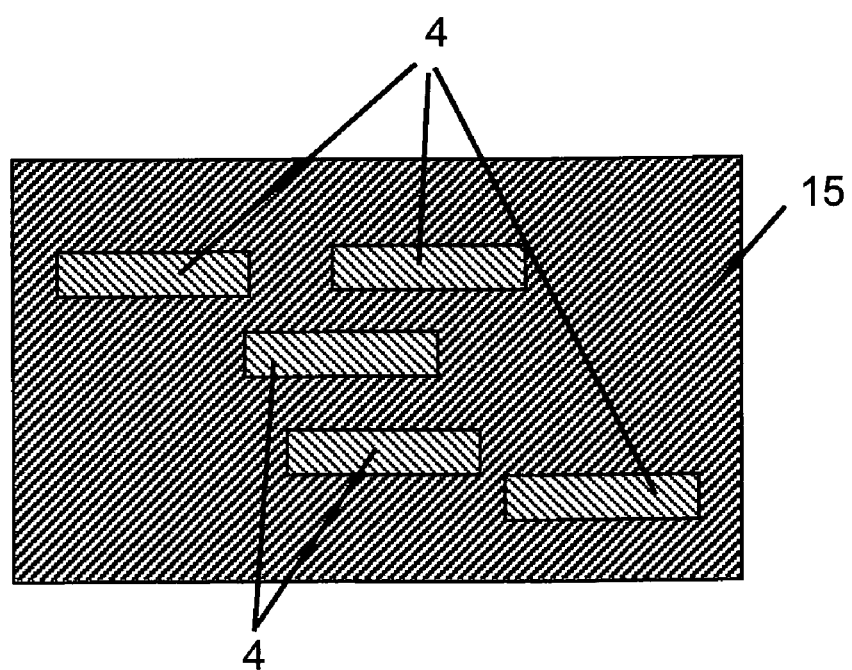
FIG. 16 is a plan view showing the manufacturing process of the transistor according to the first embodiment of the present invention.

Next, in order to clean the surface of the silicon wires 4, the silicon wires 4 are separated and collected by using the centrifugal separator from the organic solvent 12 in which the resist 5 is dissolved. Thereafter, the silicon wires 4 are placed in another organic solvent added with surface active agent so that the silicon wires 4 easily float on the solvent surface (not shown). In this embodiment, chloroform is used as the organic solvent. Subsequently, by using the Langmuir-Blodgett technique, the silicon wires 4 are floated on the solvent surface and a pressure is applied to the solvent surface. By doing so, the silicon wires 4 are directed in the same direction, and the silicon wires 4 are arrayed on the plastic substrate. FIG. 15 is a cross-sectional view showing this state, and FIG. 16 is a plan view showing this state seen from above the substrate.

Subsequently, a source electrode 16 and a drain electrode 17 are formed on the silicon wire. It is preferable that a natural oxide film (not shown) of about several atoms grown on the surface of the silicon wires 4 is removed by the cleaning by hydrofluoric acid before forming the source electrode 16 and the drain electrode 17. Also, it is desirable that the metal material having the work function appropriate for the source electrode 16 and the drain electrode 17 is selected depending on whether the transistor is to be operated on the inversion side or the storage side. More specifically, when the transistor is operated on the inversion side, it is desirable that the material having a high work function is selected for the n type silicon wire and the material having a low work function is selected for the p type silicon wire. However, since it is difficult to form an impurity diffusion layer, the Schottky barrier occurs between the source and drain electrodes 16 and 17 and the silicon wire 4 when the transistor is operated on the inversion side. Therefore, the problem of increase of the contact resistance occurs.

Figure 17:
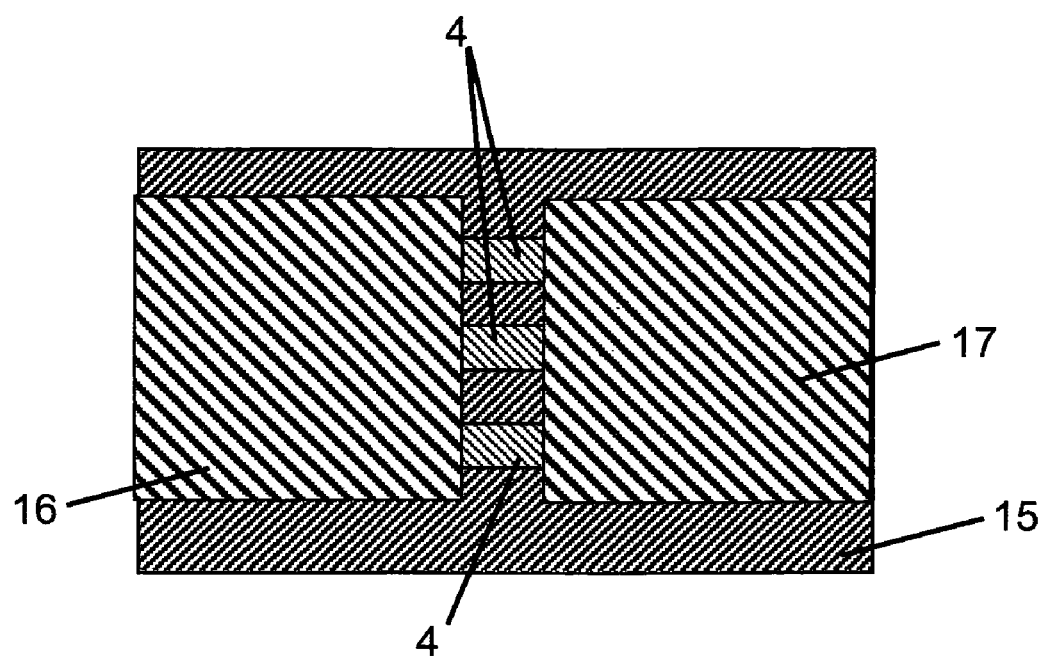
FIG. 17 is a plan view showing the manufacturing process of the transistor according to the first embodiment of the present invention.
Figure 18:
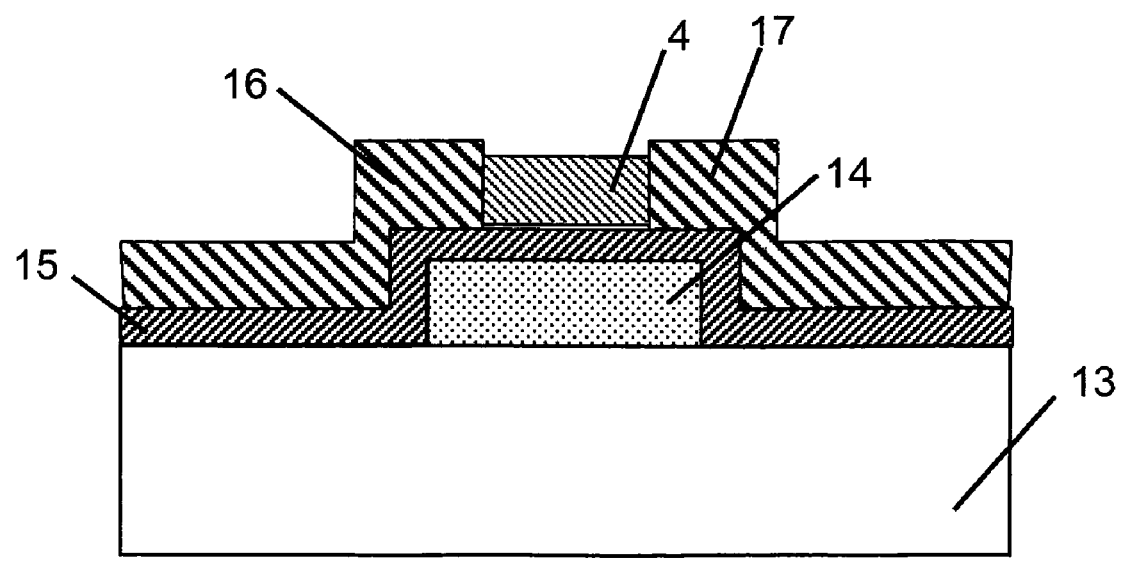
FIG. 18 is a cross-sectional view showing the completed semiconductor device according to the first embodiment of the present invention.

Meanwhile, when the transistor is operated on the storage side, it is desirable that the material having a low work function is selected for the n type silicon wire and the material having a high work function is selected for the p type silicon wire. In the case where the transistor is operated in an ON-state (state where the high current flows) on the storage side, it is necessary to control the density and the diameter of the silicon wire so that the silicon wire is completely depleted on the inversion side and the leakage current between the source electrode 16 and the drain electrode 17 on the inversion side can be prevented. In this embodiment, in order to reduce the contact resistance between the source and drain electrodes 16 and 17 and the silicon wire 4, the transistor is operated on the storage side, and Au is used as the material of the source and drain electrodes 16 and 17 for the p type silicon wire 4. On the other hand, In is used as the material of the source and drain electrodes 16 and 17 for the n type silicon wire 4. FIG. 17 is a plan view of the silicon wire transistor manufactured through the above-described process seen from above the substrate, and FIG. 18 is a cross-sectional view of the same.

Figure 19A:
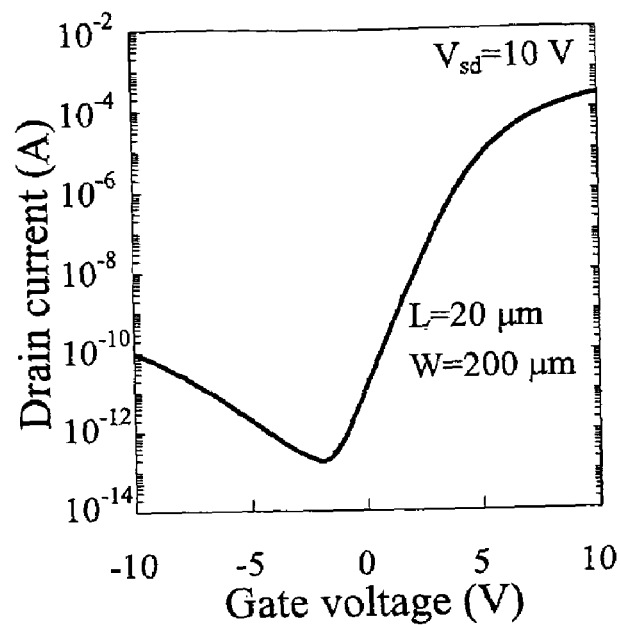
FIG. 19A is an explanatory diagram of the electrical characteristics of the n type transistor according to the first embodiment of the present invention.
Figure 19B:
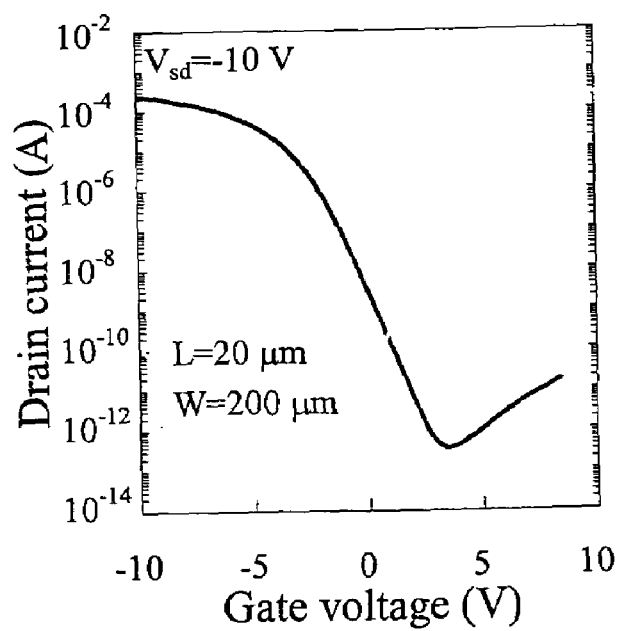
FIG. 19B is an explanatory diagram of the electrical characteristics of the p type transistor according to the first embodiment of the present invention.

In order to fabricate a desired circuit and display device by integrating the silicon wire transistors, the wiring process is performed thereafter. FIG. 19A shows the n type characteristics of the silicon wire transistor thus fabricated, and FIG. 19B shows the p type characteristics of the same. As is apparent from FIGS. 19A and 19B, the drain current is largely varied along with the change of the gate voltage in both of the p type and the n type, and the excellent subthreshold characteristics are shown. In addition, when estimating the channel mobility based on the transistor characteristics, the maximum value of the mobility of the n type is 225 $cm^2/Vs$ and that of the p type is 88 $cm^2/Vs$. Since it is possible to achieve such a high mobility, the silicon wire transistor according to this embodiment is applicable to the various flexible devices.

Also, a plastic substrate is used as the substrate for forming the transistor in this embodiment. However, a glass substrate is also available. In such a case, the process of removing the natural oxide film by hydrofluoric acid described in this embodiment is omitted. In the case where the glass substrate is used, since the silicon wires are not dispersed into the hydrofluoric acid solution, the damage to the substrate due to the remaining hydrofluoric acid can be reduced in the process of arraying the silicon wires.

Second Embodiment

For the achievement of the second object of the present invention, a method of forming a silicon wire transistor will be described, in which after forming the silicon bridge, a thermal oxide film is formed around the silicon wires at a high temperature, and the thermal oxide film is used as the gate insulating film. First, the bridge structure of the silicon wires 4 as shown in FIG. 8 is formed in the same manner as that of the first embodiment. In this second embodiment, the silicon layer 1 is doped to both p type and n type. The silicon wire 4 doped to p type is operated on the inversion side and thus functions as an nMOS, and the silicon wire 4 doped to n type is operated on the storage side and thus functions as a pMOS. In this manner, the nMOS is fabricated in a desired region on a substrate and the pMOS is fabricated in a different region on the same substrate. By doing so, the CMOS (Complementary MOS) circuit can be incorporated.

Figure 56:
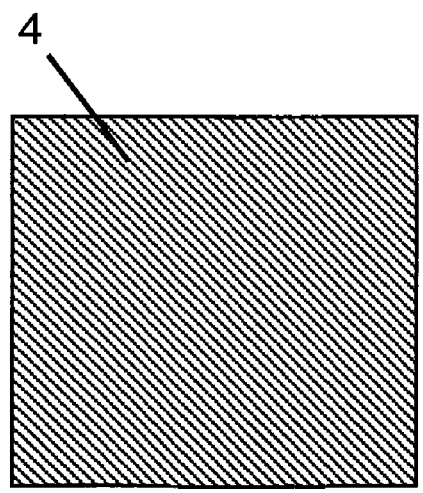
FIG. 56 is a diagram showing the cross section of the silicon wire.
Figure 57:
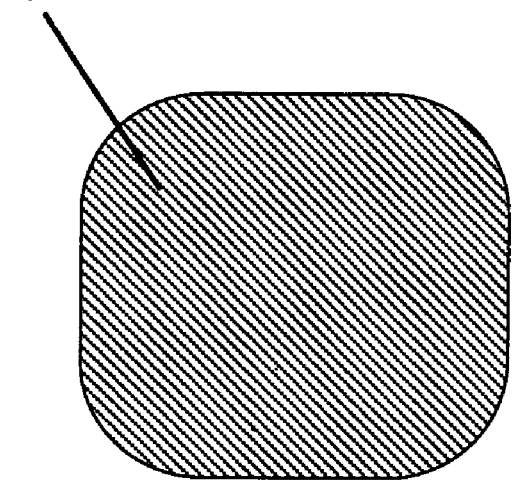
FIG. 57 is a diagram showing the cross section of the silicon wire.
Figure 58:
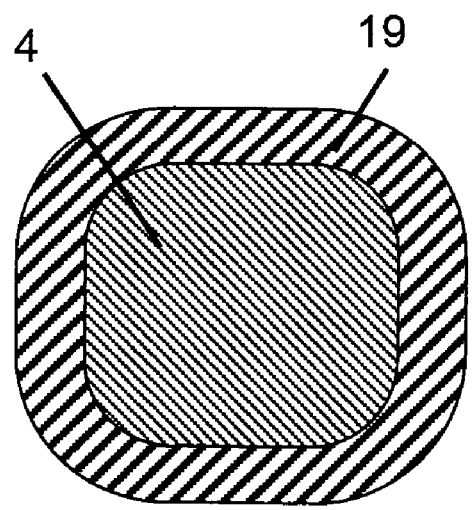
FIG. 58 is a diagram showing the cross section of the silicon wire.

FIG. 56 is an enlarged cross-sectional view showing the silicon wire 4 in FIG. 8. As is apparent from FIG. 56, the silicon wire 4 has a rectangular-pillar shape. If the silicon wire 4 with such a shape is used to fabricate the transistor, since the silicon wire 4 has corner portions on its end, the electric field is concentrated on the corner portion when the transistor is operated. As a result, the breakdown voltage is reduced. For the solution of this problem, the annealing process is performed in the atmosphere containing high-temperature hydrogen at 1000° C. in this embodiment. By performing the hydrogen annealing at such a high temperature, since the (111) surface is more stable than the other surface orientations, the silicon atoms at the corner portions are moved. As a result, the corner portions of the silicon wire 4 are rounded as shown in the enlarged view in FIG. 57. Thereafter, thermal oxidation of the surface of the silicon wire 4 is performed in the diluted oxygen atmosphere at a high temperature of 1050° C. By doing so, a silicon oxide film which is a thermal oxide film with a thickness of 5 nm to be a gate insulating film 19 is formed. FIG. 58 is an enlarged cross-sectional view of this state. In FIG. 58, the roundness at the corner portions are emphasized so as to make the difference easily understood. However, since the roundness is so slight in the actual case, the roundness at the corner portions is not emphasized in the following diagrams. Also, since the silicon oxide film is formed on the exposed surfaces almost uniformly, the silicon oxide film is formed around the periphery of the silicon wire.

Figure 20:
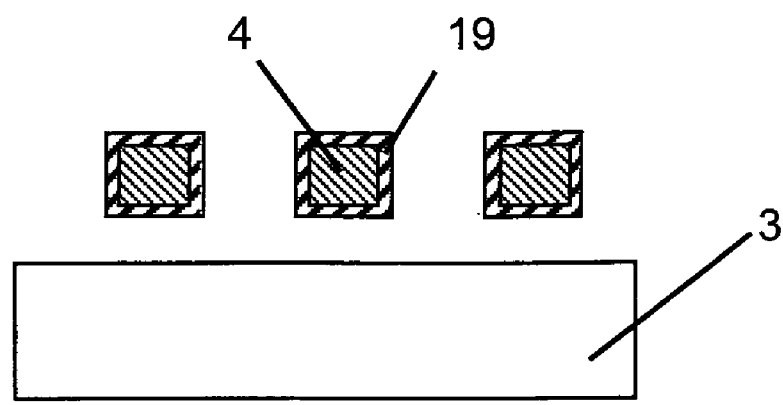
FIG. 20 is a cross-sectional view showing the manufacturing process of the field effect transistor according to the second embodiment of the present invention.
Figure 21:
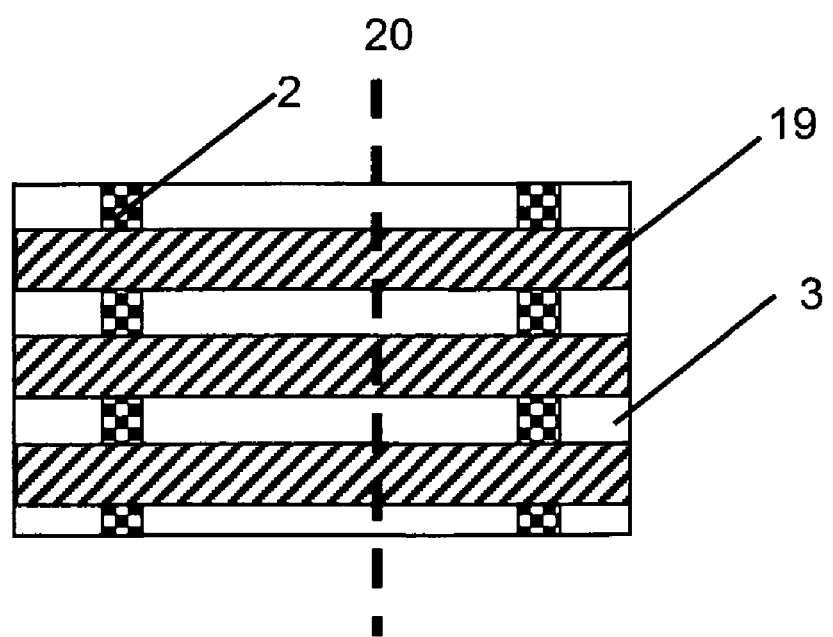
FIG. 21 is a plan view showing the manufacturing process of the transistor according to the second embodiment of the present invention seen from above.

FIG. 21 is a schematic diagram showing this state seen from above the substrate. The gate insulating film 19 formed around the silicon wire 4 can be seen from above. FIG. 20 is a cross-sectional view taken along the dotted line 20 in FIG. 21. Subsequently, for the improvement of the device performance, the annealing process is performed in the hydrogen atmosphere at 400° C. so as to reduce the defect density caused between the gate insulating film 19 and the silicon wire 4. By doing so, the interface defect density can be reduced to about $1 \times 10^{11}$ cm$^{-2}$.

Figure 22:
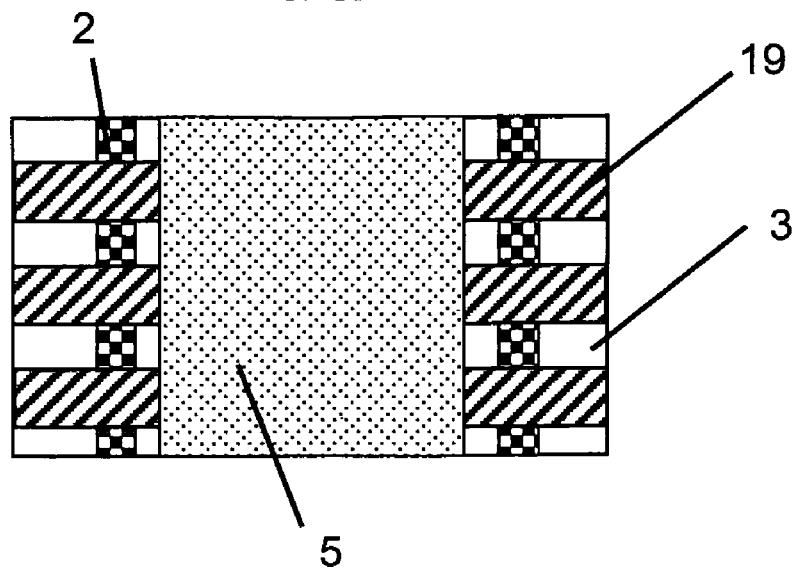
FIG. 22 is a plan view showing the manufacturing process of the transistor according to the second embodiment of the present invention seen from above.
Figure 23:
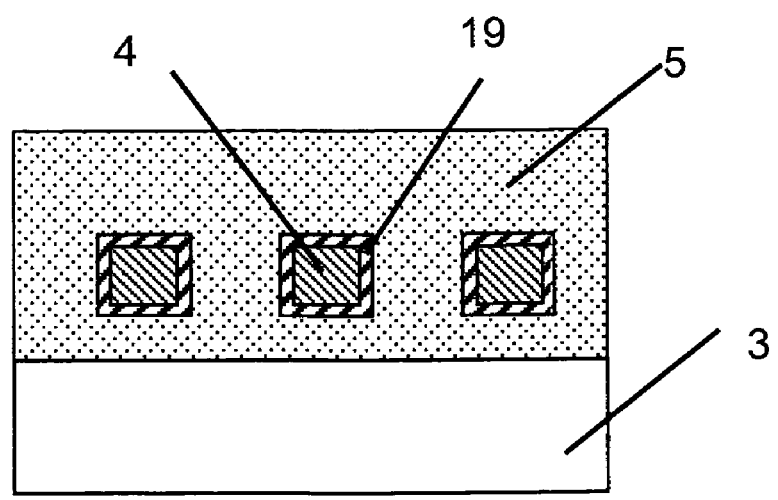
FIG. 23 is a cross-sectional view showing the manufacturing process of the transistor according to the second embodiment of the present invention.

Subsequently, the central parts of the bridges, that is, the silicon wires 4 covered with the gate insulating film 19 of the bridge structure are covered with the resist 5 by using the lithography as shown in FIG. 22. The resist film 5 partly covers the upper surface and the lower surface of the silicon wires and the surface of the silicon substrate 3 in the region where the silicon oxide 2 has been removed. In this case, the resist covering the upper surface of the silicon wires is used as an etching mask in the latter process and the resist covering the lower surface of the silicon wires has a function to bond the silicon substrate 3 and the silicon wires. FIG. 23 is a cross-sectional view showing the central part of the bridges in the state of FIG. 22.

Subsequently, after removing the gate insulating film 19 on the bridge girders of the silicon bridges by using hydrofluoric acid, the silicon wires 4 on the bridge girders are removed by the dry etching. By doing so, the state equal to that of FIG. 11 described in the first embodiment is obtained. In this process, the separation between the silicon wires 4 and the oxide film 2 is required. Therefore, it is also possible to remove the oxide film 2 serving as the bridge girder of the supporting parts. However, in the case where the silicon wires are removed, the silicon wires covered with the resist 5 are left. Therefore, it is possible to obtain the silicon wires with a desired length.

FIG. 58 shows the shape of the tip portion of the silicon wire 4 found on the boundary surface of the resist 5 after this dry etching. Therefore, it is desirable to unintentionally prevent the short-circuit between the tip portion of the silicon wire 4 and the gate electrode formed later. For its achievement, when performing the dry etching described above, the tip portion of the silicon wire 4 is over-etched by using the isotropic dry etching until the surface of the silicon wire 4 retracts into the gate insulating film 19. Further, it is also desirable that the radical oxidation in the oxygen plasma is performed on condition that the resist film 5 is not removed, thereby oxidizing the surface of the tip portion of the silicon wire 4 to form an oxide film on the tip portion. This oxide film functions only to prevent the short-circuit between the silicon wire 4 and the gate electrode 14 and does not function as a gate insulating film. Therefore, the oxide film formed by the low-temperature oxidation process is applicable, and the oxide film formed by the chemical oxidation using, for example, ozone water is also available.

Figure 59:
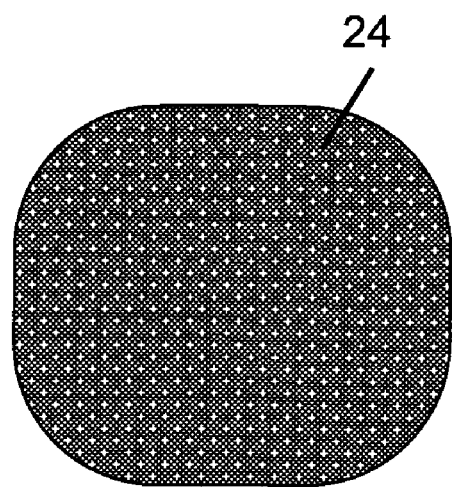
FIG. 59 is a diagram showing the cross section of the silicon wire.

For the insulation of the tip portion of the silicon wire 4, it is preferable that the following process is performed in addition to the above-described over etching process and the oxidation process. First, the substrate is placed into a solution containing thermosetting resin 24. Then, the heat treatment at 150° C. is performed to the substrate to harden the thermosetting resin 24. FIG. 59 shows the tip portion at this time. In this embodiment, the thickness of the thermosetting resin 24 is 5 nm. When the thermosetting resin 24 is attached to the tip portion, the electric insulation between the silicon wire 4 and the gate electrode 14 is maintained even if the thermosetting resin 24 comes in contact with the gate electrode 14.

Next, in the same manner as disclosed in the first embodiment, the entire wafer is placed in a beaker 11 of organic solvent 12 which dissolves the resist 5, and then, the silicon wires 4 covered with the gate insulating film 19 are separated and collected by using the centrifugal separator. By doing so, the silicon wires 4 around which the high-quality oxide film fabricated at a high temperature is formed can be collected in the solution.

Here, the silicon wire formed in this embodiment will be described in detail. The silicon wire formed in this embodiment has the thermal oxide film with an almost uniform thickness formed on its surfaces (including curved surfaces) which are parallel to the axial direction of the silicon wire (hereinafter, referred to as the periphery or peripheral surface of the silicon wire). Also, the thermal oxide film covers the periphery of the silicon wire and is formed around the silicon wire. In other words, in the cross-section taken along the line vertical to the axial direction of the silicon wire, the thermal oxide film completely covers the semiconductor, and the semiconductor and the thermal oxide film have the same center, that is, are concentric. Note that when the silicon wires made of semiconductor only are arranged on a substrate and then the thermal oxidation is performed to the silicon wires, since the surface of the silicon wire brought into contact with the substrate is not exposed, this surface is not oxidized and the peripheral surfaces of the silicon wire cannot be covered with the thermal oxide film.

Figure 24:
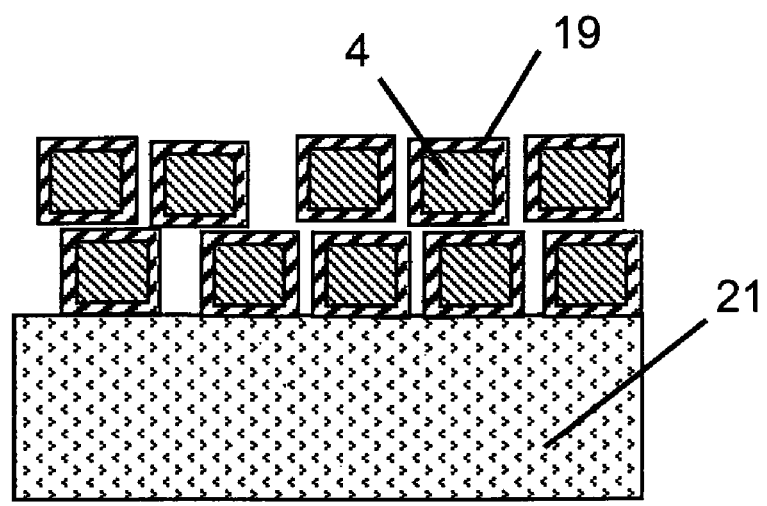
FIG. 24 is a cross-sectional view showing the manufacturing process of the transistor according to the second embodiment of the present invention.
Figure 25:
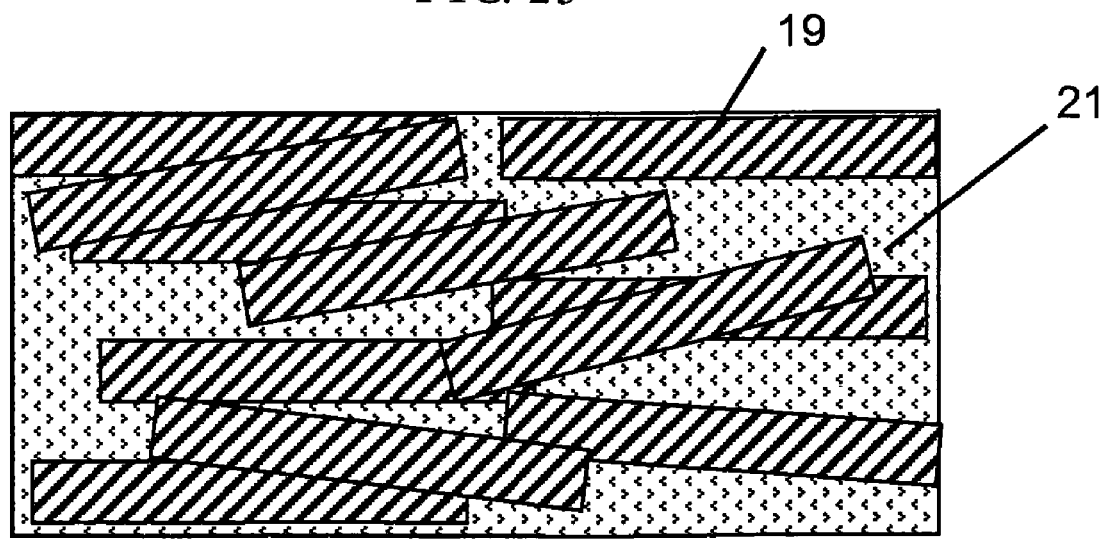
FIG. 25 is a plan view showing the manufacturing process of the transistor according to the second embodiment of the present invention seen from above.

Next, in order to evaluate the performance of the silicon wires 4 around which the gate insulating film 19 is formed, a transistor is fabricated on a glass substrate 21 in this embodiment. First, by using the Langmuir-Blodgett technique, the silicon wires 4 are floated on the solvent surface and a pressure is applied to the solvent surface. By doing so, the silicon wires 4 are directed in the same direction. Then, the silicon wires 4 are adhered to the glass substrate 21. In this embodiment, the Langmuir-Blodgett technique is performed twice in succession, and the silicon wires 4 are laminated as shown in FIG. 25. FIG. 24 is a cross-sectional view in this state. In such a two-stage structure, the ON-current of the transistor is significantly increased because the current in the ON-state of the transistor is proportional to the number of silicon wires 4. Although FIG. 25 shows the state where the silicon wires 4 in the second stage are slightly disarrayed, since the channel passes through the silicon wires 4, this disarray does not act as a scatterer.

Figure 26:
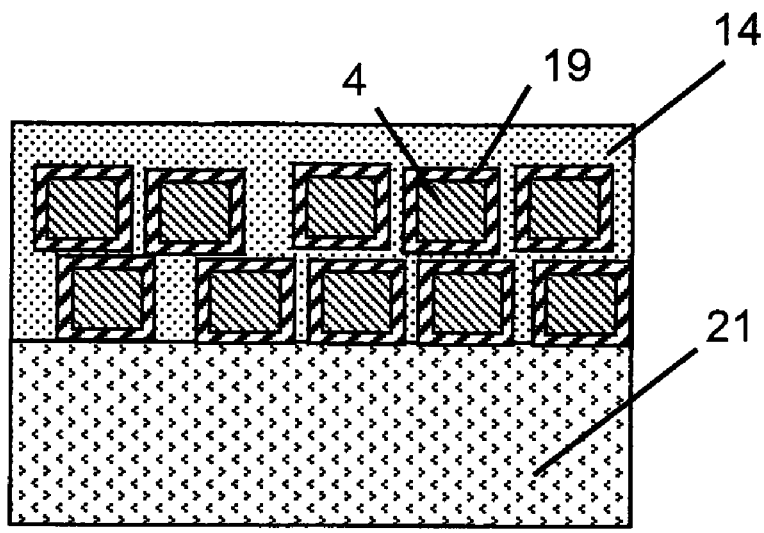
FIG. 26 is a cross-sectional view showing the manufacturing process of the transistor according to the second embodiment of the present invention.
Figure 27:
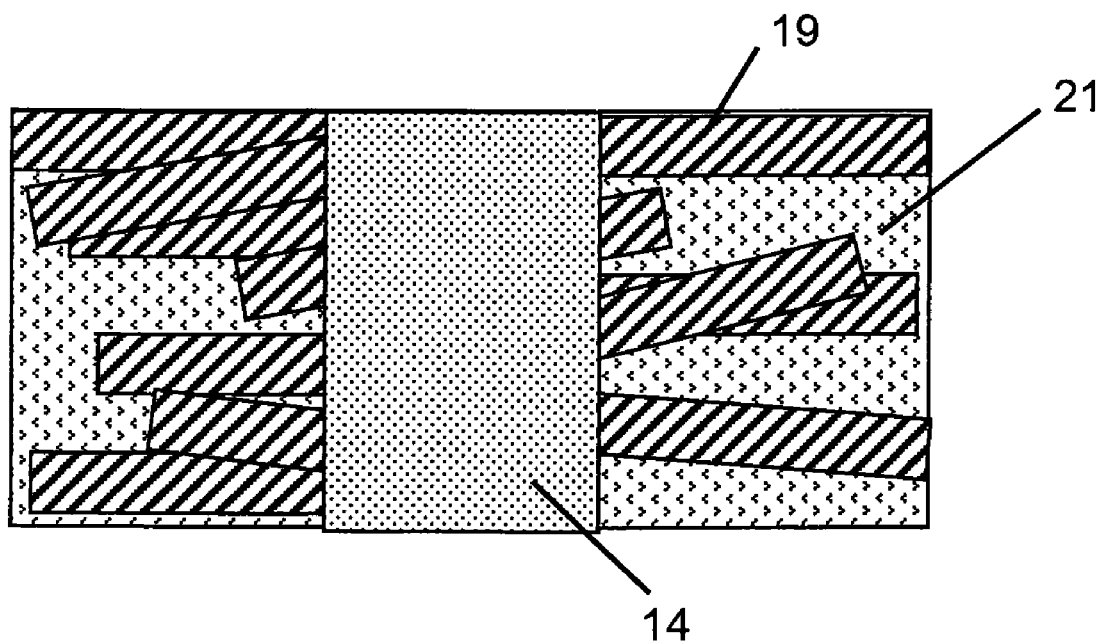
FIG. 27 is a plan view showing the manufacturing process of the transistor according to the second embodiment of the present invention seen from above.
Figure 28:
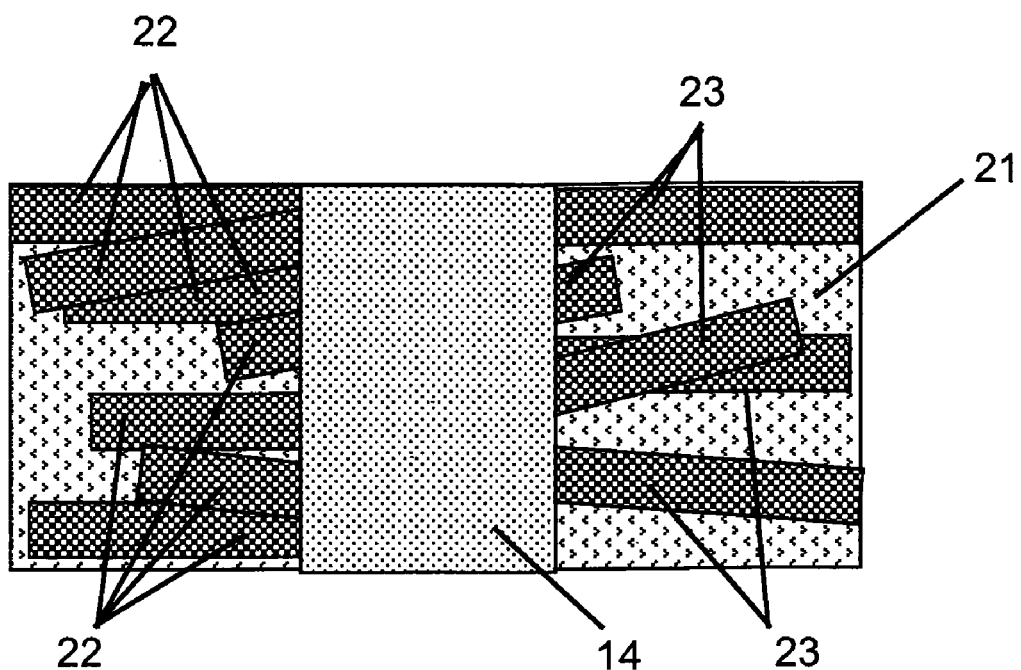
FIG. 28 is a plan view showing the manufacturing process of the transistor according to the second embodiment of the present invention seen from above.

Subsequently, after depositing Al on the whole surface, the Al is processed by using the lithography and the wet etching, and the gate electrode 14 is formed as shown in FIG. 27. Also, FIG. 26 is a cross-sectional view showing the state of FIG. 27. Subsequently, a resist is processed so that the ions can be implanted into only the desired region, and then, phosphorus is ion-implanted when forming an nMOS and boron is ion-implanted when forming a pMOS. Thereafter, the activation annealing for 10 seconds at a high temperature of 1000° C. (Rapid Thermal Annealing) is performed to form source diffusion layers 22 and drain diffusion layers 23 as shown in FIG. 28.

Figure 29:
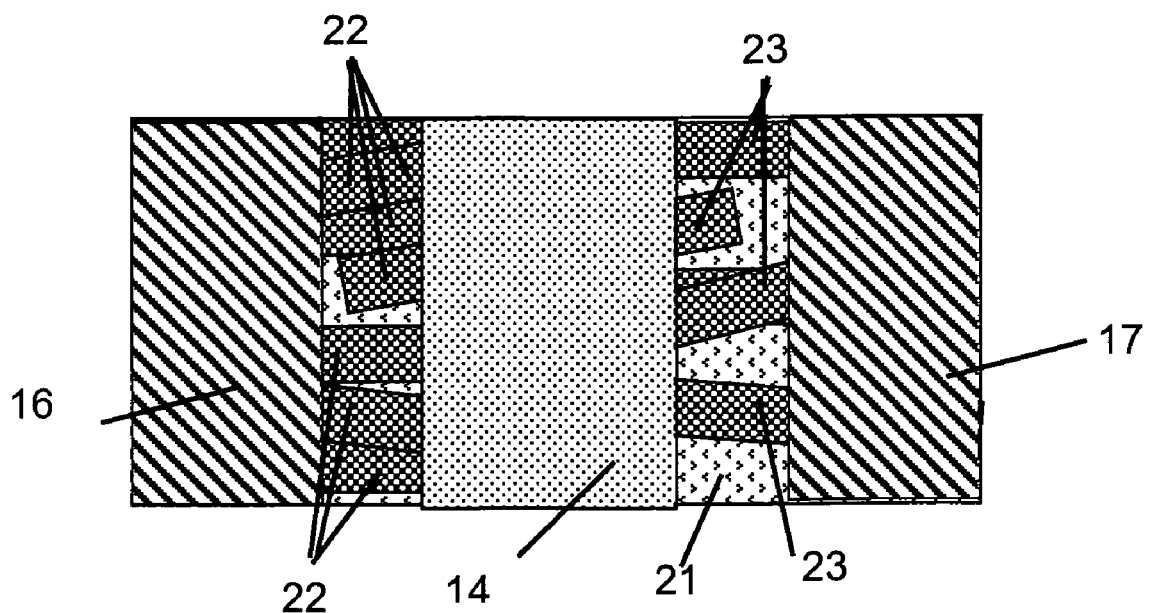
FIG. 29 is a plan view showing the completed transistor according to the second embodiment of the present invention seen from above.
Figure 30:
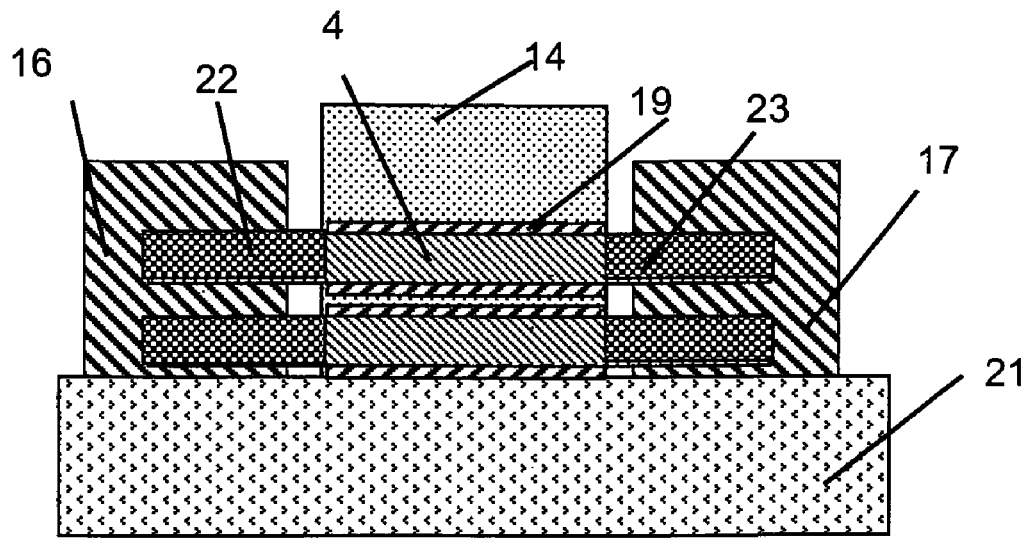
FIG. 30 is a cross-sectional view showing the completed transistor according to the second embodiment of the present invention.

Subsequently, after forming openings in the desired positions of the source diffusion layers 22 and the drain diffusion layers 23 by using the patterning of the resist by lithography, the gate insulating film 19 in the opening is removed by hydrofluoric acid, and then, the resist is removed. Thereafter, after depositing Al on the whole surface, the Al is processed by using the lithography and the wet etching to form the source electrode 16 and the drain electrode 17 as shown in FIG. 29. In this manner, the silicon wire transistor 25 is completed. FIG. 30 is a schematic cross-sectional view in the state of FIG. 29.

As is already shown in FIG. 29, a plurality of silicon wires 4 are connected to the source electrode 16 and the drain electrode 17, and all of the connected silicon wires 4 contribute to the characteristics of the transistor. From the viewpoint of the characteristics of the transistor, the transistor having the larger ON-current is more desirable because the larger the ON-current becomes, the more the driving power is increased. When a plurality of silicon wires 4 are provided in one silicon wire transistor as described in this embodiment, the large ON-current proportional to the number of silicon wires 4 can be obtained.

On the other hand, some of the silicon wires 4 are connected to either of the source electrode 16 or the drain electrode 17 and there are also the silicon wires 4 not connected to both of the source electrode 16 and the drain electrode 17. The silicon wires 4 which do not connect the source electrode 16 and the drain electrode 17 do not contribute to the transistor characteristics. However, since the silicon wires are merely unconnected, they do not cause the degradation of the device characteristics.

Figure 31:
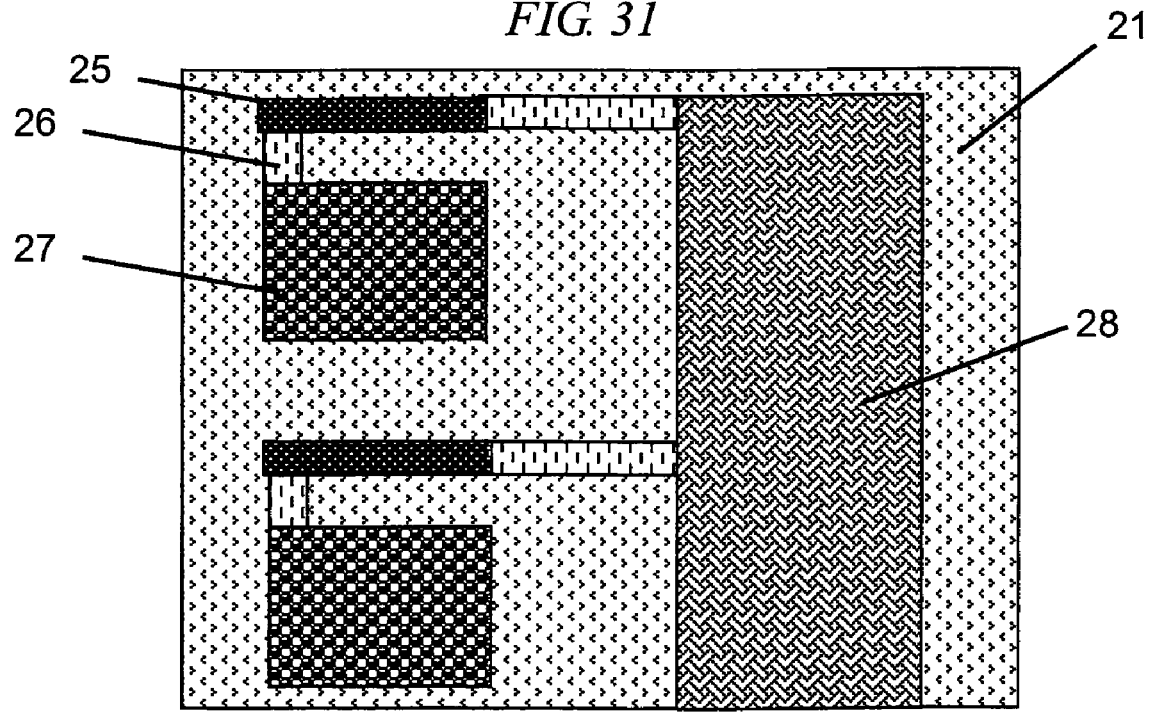
FIG. 31 is a plan view showing the completed display according to the second embodiment of the present invention.

Subsequently, in order to evaluate the performance of the silicon wire transistor 25, a display using the silicon wire transistors 25 is fabricated in this embodiment. As schematically shown in FIG. 31, the silicon wire transistor 25 is connected to a light-emitting element 27 via the wiring 26. In this embodiment, an organic EL (Electro-Luminescence) is used as the light-emitting element 27. The so-called active matrix display in which one light-emitting element 27 is connected to each one silicon wire transistor 25 is fabricated in this embodiment. Thereafter, the display is completed through the process of fabricating desired circuits and the passivation process. In this embodiment, the silicon wires are also used for the fabrication of the CMOS circuit to be a driver for driving the display.

As a result of the analysis of the characteristics of the transistor according to this embodiment, the channel mobility of the nMOS is 437 $cm^2/Vs$ and that of the pMOS is 132 $cm^2/Vs$. These values are almost equal to those obtained in the standard LSI using the single crystal bulk silicon and the substrate with the same density. This is because a quite high-quality thermal oxide film is used as the gate insulating film 19 and thus the interface state can be significantly reduced.

Also, it is found out that the ON-current of the transistor is increased in proportion to the number of silicon wires 4. Therefore, by laminating the silicon wires 4 as described in this embodiment, the ON-current per unit area on the glass substrate can be increased almost twice in comparison to the case where the silicon wires are not laminated.

Furthermore, since the silicon wire 4 according to this embodiment is covered with the gate insulating film 19 and the gate electrode 14, the channel can be formed around the entire surface of the concentric periphery of the silicon wire. This corresponds to the increase of the effective width W of the transistor if converted to the field effect transistor using a standard bulk silicon. For easier understanding, if the silicon wire 4 has a cuboid shape with the length of "a" on a side, W=4×a. Therefore, owing to the increase effect of the effective width W, the ON-current can be increased almost four times. Considering the effect of the increase of the effective width and the effect of the lamination in combination, the silicon wire transistor 25 according to this embodiment can increase the ON-current almost eight times in comparison to that of the field effect transistor using the bulk silicon.

In addition, since the silicon wire 4 according to this embodiment uses the high-quality single crystal silicon taken from the SOI substrate, the variation in the threshold voltage of the transistor can be significantly reduced to ±0.05 V or less. This is one order of magnitude less than that of the standard TFT (Thin Film Transistor) using the polysilicon. In the case where the organic EL is used as the light-emitting element 27, it is significantly important to reduce the threshold voltage, and the silicon wire transistor 25 according to this embodiment is extremely effective as the transistor for driving the organic EL.

Although the silicon wire transistor is formed on a glass substrate in this embodiment, a substrate made of a material with an upper temperature limit of 400° C. or lower such as plastic is also available. In this case, the silicon wire having the high-quality thermal oxide film cannot be used for the flexible transistor.

Third Embodiment

The second embodiment discloses the method of collecting the silicon wires 4, around which the gate insulating film 19 fabricated by the high-temperature oxidation process is formed, without losing the gate insulating film 19. However, the processing techniques used in the standard silicon process, for example, the lithography process, the ion implantation, and the high-temperature activation process are required in order to fabricate the transistor in accordance with the method described in the second embodiment. Therefore, the application to the flexible transistor is difficult due to the high cost. This third embodiment discloses the technology in which the high-cost processing technique, for example, the lithography process is not used after collecting the silicon wires 4, and the silicon wire transistor is fabricated on the plastic substrate by using the printing method in a self-aligned manner.

Figure 32:
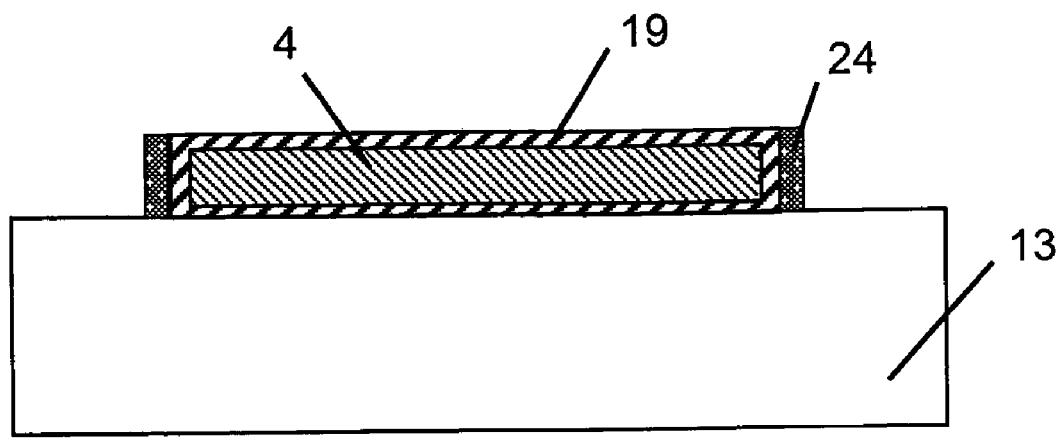
FIG. 32 is a cross-sectional view showing the manufacturing process of the transistor according to the third embodiment of the present invention.

First, the silicon wires 4 around which the gate insulating film 19 is formed are fabricated and collected in the same manner as described in the second embodiment. Next, the silicon wires 4 are arrayed on the plastic substrate 13 by using the Langmuir-Blodgett technique as shown in FIG. 32.

Figure 33:
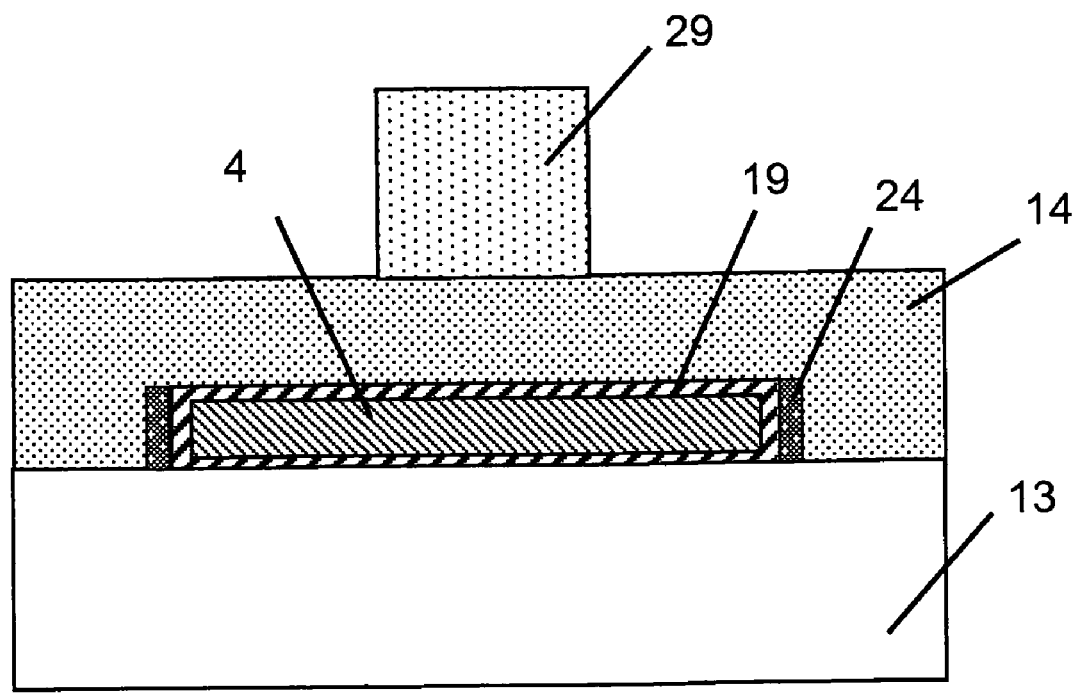
FIG. 33 is a cross-sectional view showing the manufacturing process of the transistor according to the third embodiment of the present invention.
Figure 34:
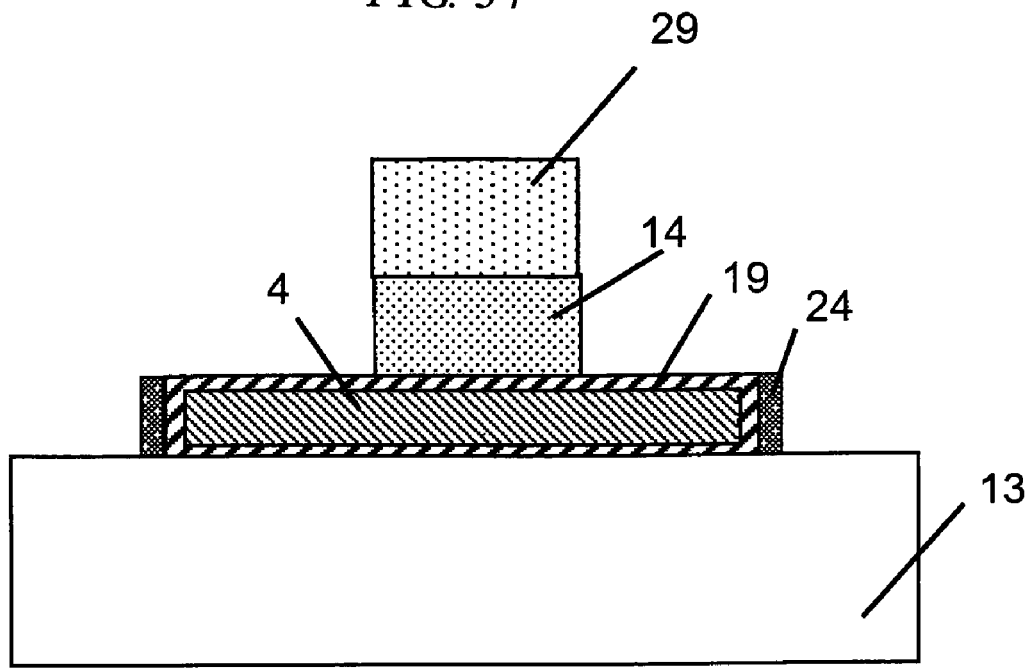
FIG. 34 is a cross-sectional view showing the manufacturing process of the transistor according to the third embodiment of the present invention.

Subsequently, Al to be the gate electrode 14 is deposited on the whole surface of the plastic substrate 13. Thereafter, the organic insulator 29 is processed into a linear shape by using the printing method as shown in FIG. 33. In this embodiment, polyimide is used as the organic insulator 29. Next, the Al is wet etched by the solution containing phosphoric acid, acetic acid, and nitric acid with using the organic insulator 29 as an etching mask, thereby forming the gate electrode 14 as shown in FIG. 34.

Figure 35:
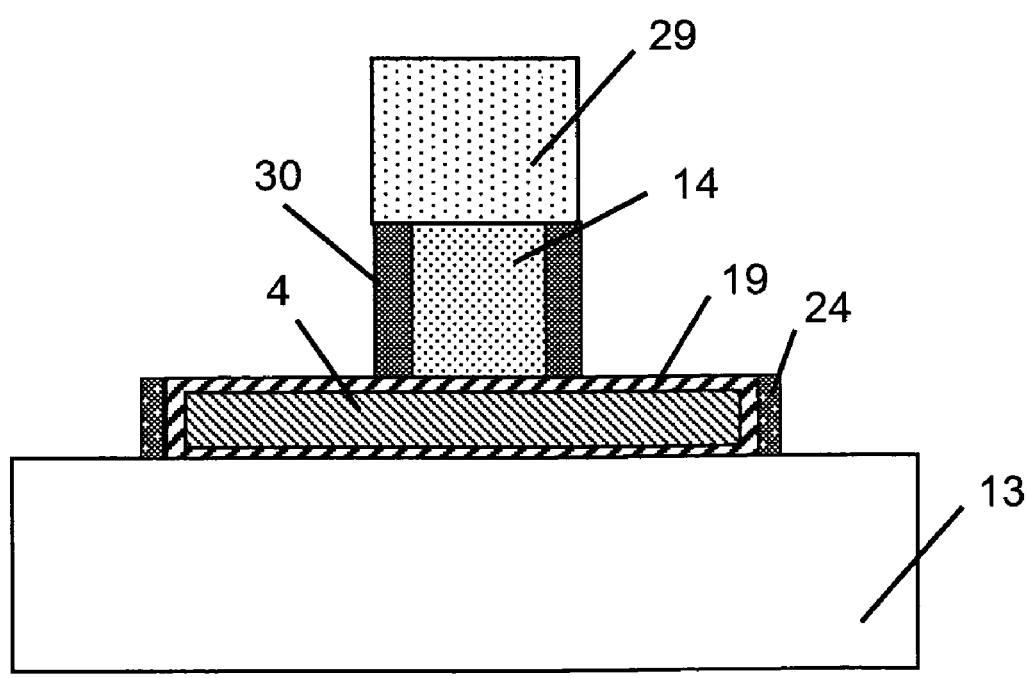
FIG. 35 is a cross-sectional view showing the manufacturing process of the transistor according to the third embodiment of the present invention.

Next, by oxidizing the surface of the gate electrode 14, an $Al_2O_3$ film of 10 nm thickness to be the sidewall insulating film 30 is formed as shown in FIG. 35. In this embodiment, the anodic oxidation method is used when oxidizing the Al. The annealing process in the low-temperature oxygen atmosphere is also available as the manufacturing method of the sidewall insulating film 30. Subsequently, the gate insulating film 19 is partly removed by the wet etching using hydrofluoric acid, thereby partly exposing the silicon wire 4 as shown in FIG. 36.

Subsequently, by using the printing method, the solvent of gold nanoparticles with a diameter of 5 nm is dropped onto the exposed part of the silicon wire 4, and then, the annealing process at 100° C. is performed. By doing so, the source and drain electrodes 16 and 17 comprised of gold electrodes are formed as shown in FIG. 37. In this embodiment, a plastic substrate with an upper temperature limit of 300° C. is used as the plastic substrate 13. Therefore, the annealing at 100° C. is sufficiently low and does not cause any problem.

Thereafter, the desired circuits are formed through the wiring process. As a result, it is verified that the silicon wire transistor formed in the self-alignment manner exhibits the preferable device characteristics. Particularly, it is verified that the silicon wire transistor having the channel length of 1 μm or smaller which is relatively small as the flexible transistors is well operated on the plastic substrate.

Fourth Embodiment

In the second and third embodiments, a method of fabricating a silicon wire in which a gate insulating film 19 is formed around a silicon wire 4 and a method of fabricating a transistor using the silicon wire 4 are disclosed. In this fourth embodiment, a method of fabricating a silicon wire with a structure like a coaxial cable by coaxially forming a gate electrode around the gate insulating film 19 and a method of fabricating a transistor using the silicon wire 4 will be disclosed.

Also, in the first to third embodiments, the silicon wires 4 are directed in the same direction by using the Langmuir-Blodgett technique. However, since the Langmuir-Blodgett technique is not suitable for the case of using a large-area plastic substrate, the method of arraying the silicon wires 4 without using the Langmuir-Blodgett technique will be disclosed in this embodiment.

Figure 38:
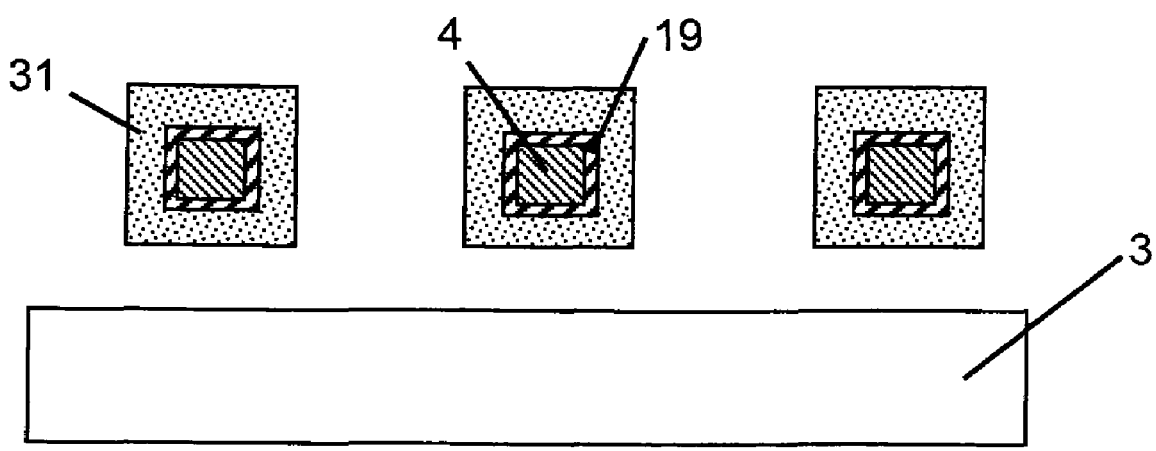
FIG. 38 is a cross-sectional view showing the manufacturing process of the transistor according to the fourth embodiment of the present invention.
Figure 39:
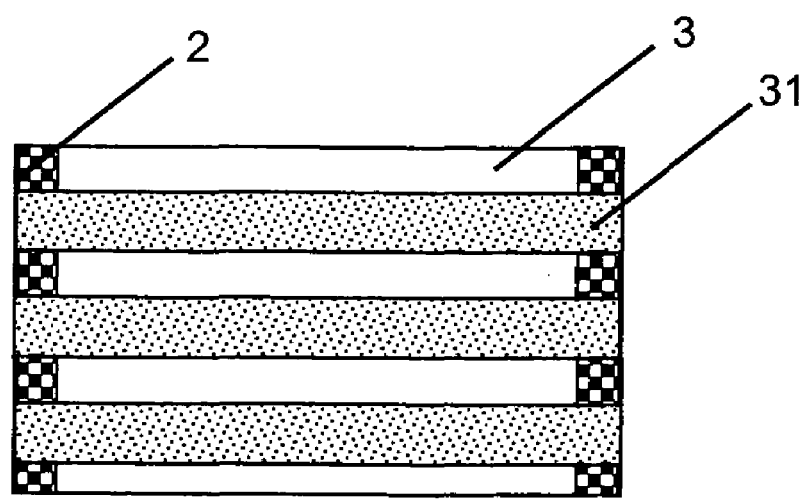
FIG. 39 is a plan view showing the manufacturing process of the transistor according to the fourth embodiment of the present invention seen from above.
Figure 60:
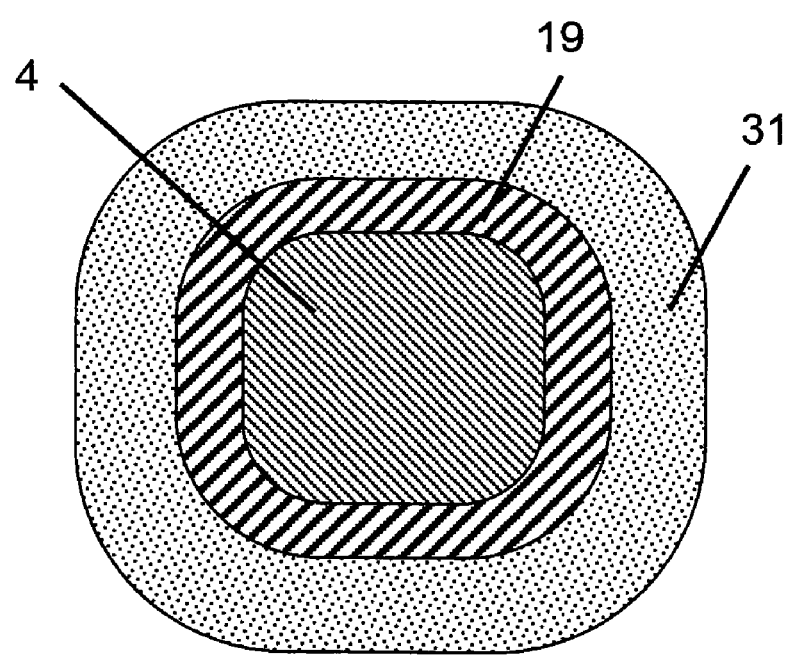
FIG. 60 is a diagram showing the cross section of the silicon wire.

First, the SOI substrate is processed into the bridge structure and the gate insulating film 19 is formed around the silicon wires 4 in the same manner as described in the second embodiment. Subsequently, a coaxial gate electrode 31 comprised of a tungsten (W) film of 10 nm and a titanium nitride (TiN) film of 50 nm is formed around the gate insulating film 19 by the CVD (Chemical Vapor Deposition) method as shown in FIG. 38. FIG. 39 is a plan view showing this state seen from above the substrate, and FIG. 60 is an enlarged cross-sectional view of the silicon wire 4. Although the coaxial gate materials are formed also on the substrate 3, the description thereof is omitted in the drawings.

Next, a heat-resistant plastic made of transparent fluorine resin is prepared as the plastic substrate 13 in this embodiment. A film of the thermosetting resin 24 is formed on a front surface of the plastic substrate 13 by the spin coating. Subsequently, the plastic substrate 13 is placed on the SOI substrate so that the surface of the plastic substrate on which the thermosetting resin 24 is coated comes into contact with the coaxial gate electrode 31. Thereafter, the thermal treatment at 150° C. is performed to adhere the thermosetting resin 24 to the coaxial gate electrode 31. Subsequently, by placing the entire sample in a solution containing hydrofluoric acid, the insulating film 2 is removed and the substrate 3 is separated. By doing so, the silicon wire 4 around which the gate insulating film 19 and the coaxial gate electrode 31 are formed can be arrayed on the plastic substrate as shown in FIG. 40.

Note that the method of arraying the silicon wires 4 on the plastic substrate 13 disclosed in this embodiment is characterized in that the high-quality gate insulating film 19 formed by the thermal oxidation process is provided. This was impossible in the prior art in which the coaxial gate electrode 31 is not used and hydrofluoric acid is used. Furthermore, different from the transfer method in which the circuit fabricated on the SOI substrate is transferred onto the plastic substrate, the silicon wires 4 are transferred onto the plastic substrate in the method disclosed in this embodiment.

Figure 40:
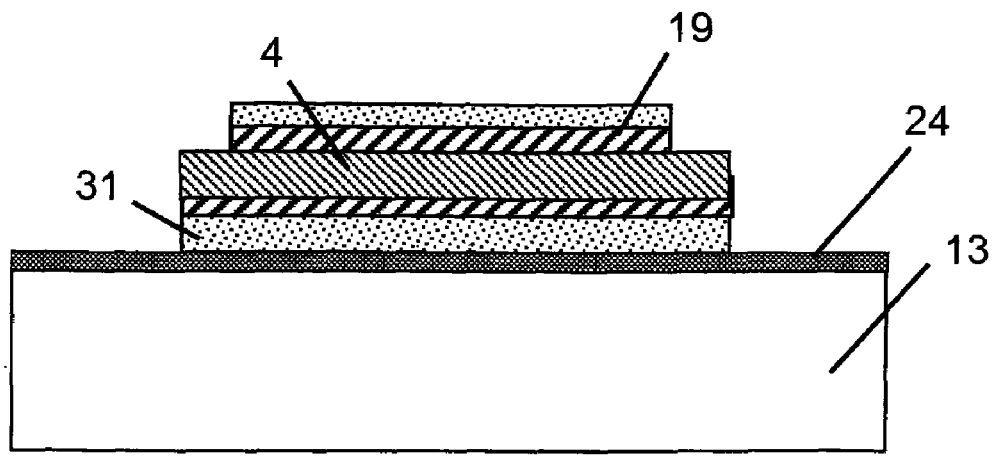
FIG. 40 is a cross-sectional view showing the manufacturing process of the transistor according to the fourth embodiment of the present invention.

Also, since the $SiO_2$ in the region where the silicon oxide 2 has been removed is removed in FIG. 39, the gate insulating film 19 at the tip portion of the silicon wire is partly removed as shown in FIG. 40. However, if the transistor is designed so that the gate electrode 14 is not provided on this part when the transistor structure is completed, the short-circuit between the silicon wire 4 and the gate electrode 14 does not occur. Actually, in this embodiment, the tip portions of the silicon wire 4 can be designed to be connected to the source electrode 16 and the drain electrode 17 and are electrically isolated from the gate electrode 14 as shown later in FIG. 45.

Figure 41:
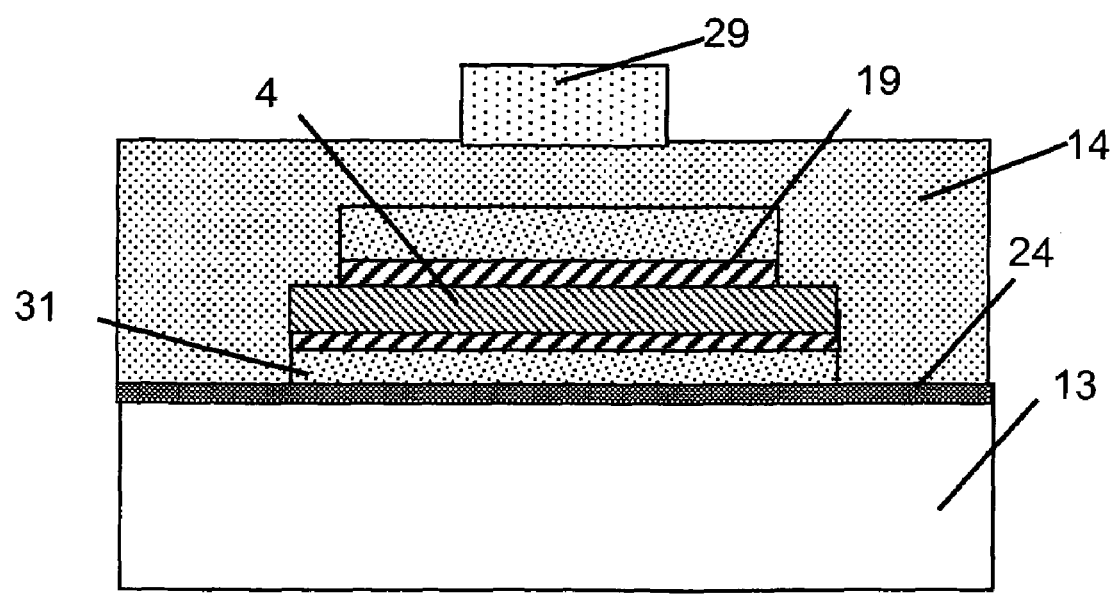
FIG. 41 is a cross-sectional view showing the manufacturing process of the transistor according to the fourth embodiment of the present invention.
Figure 42:
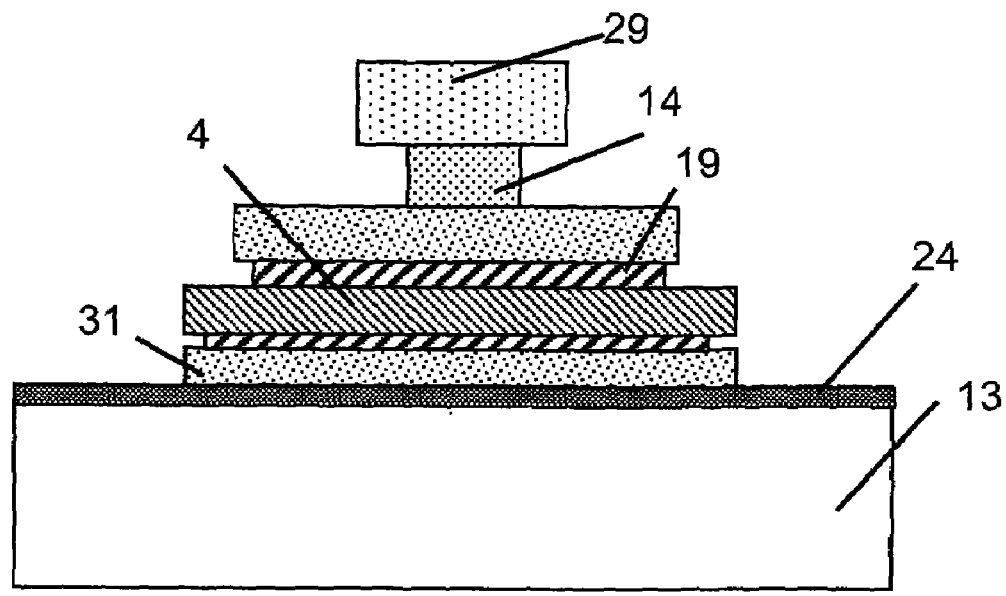
FIG. 42 is a cross-sectional view showing the manufacturing process of the transistor according to the fourth embodiment of the present invention.
Figure 43:
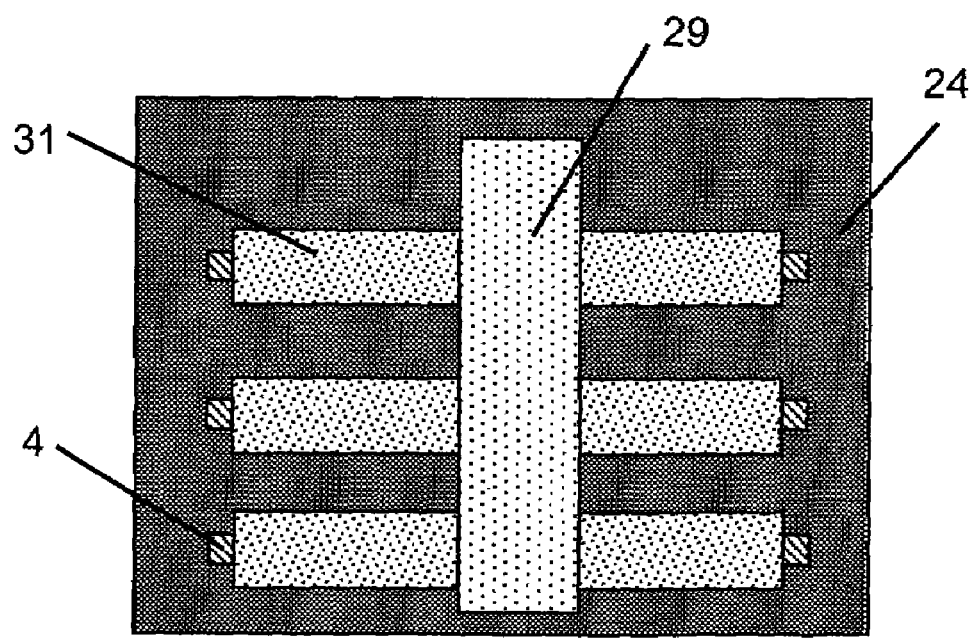
FIG. 43 is a plan view showing the manufacturing process of the transistor according to the fourth embodiment of the present invention seen from above.

Subsequently, after depositing Al on the whole surface of the substrate, the organic insulator 29 made of polyimide is processed into a linear shape by using the printing method as shown in FIG. 41. Subsequently, the Al is processed to form the gate electrode 14 by using the wet etching solution for Al as shown in FIG. 42. In this case, the gate electrode 14 needs to come into contact with the coaxial gate electrode 31, and the Al is over-etched so that the gate electrode 14 does not come into contact with the source electrode 16 and the drain electrode 17. Consequently, the end portion of the gate electrode is retracted inside the organic insulator 29. FIG. 43 shows the state at this time seen from above the substrate.

Figure 44:
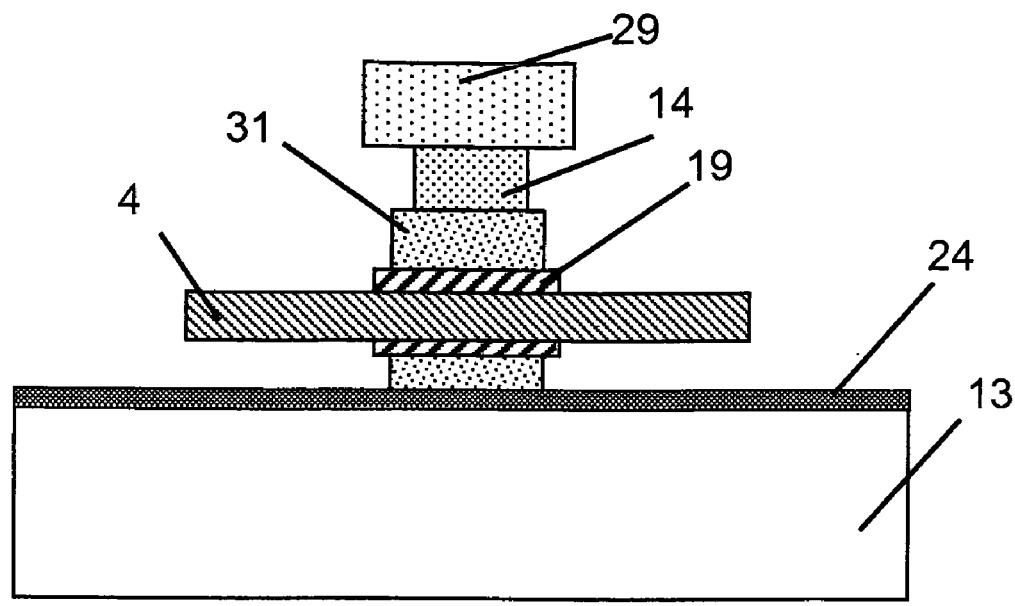
FIG. 44 is a cross-sectional view showing the manufacturing process of the transistor according to the fourth embodiment of the present invention.

Next, the coaxial gate electrode 31 and the gate insulating film 19 are partly removed at the same time. For this purpose, an etching solution is prepared. At this time, in order to prevent the short-circuit between the coaxial gate electrode 31 and the silicon wire, the etching solution with the etching rate for the coaxial gate electrode 31 higher than the etching rate for the gate insulating film 19 is prepared. In this embodiment, when creating the solution containing $H_2O_2$ and $NH_4OH$, the concentration of HF is set relatively low, thereby achieving the condition described above. As a result, as shown in FIG. 44, the coaxial gate electrode 31 is etched more deeply than the gate insulating film 19.

Figure 45:
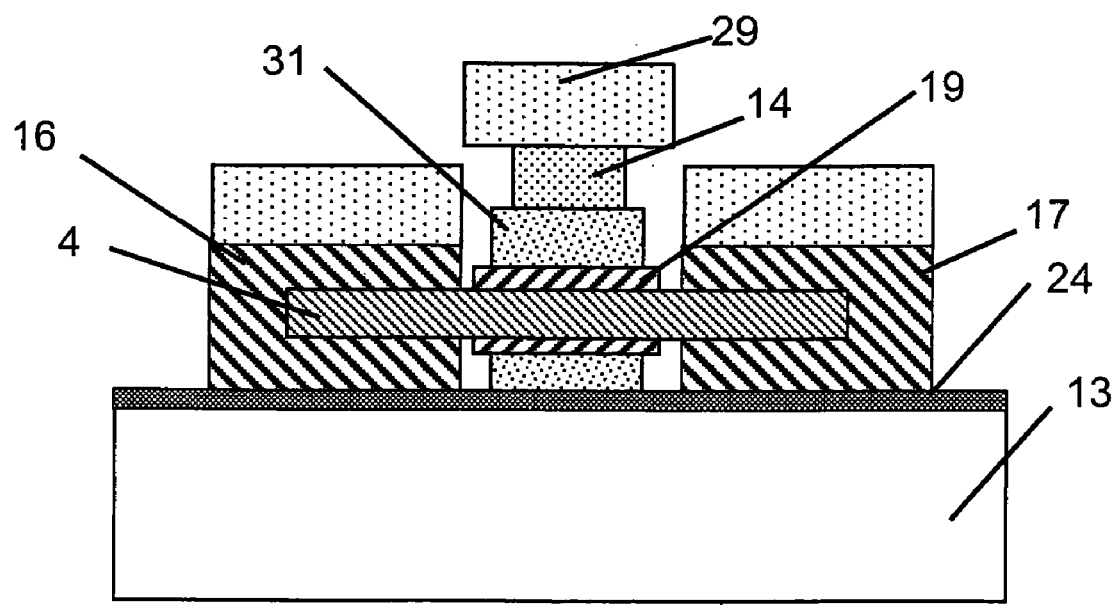
FIG. 45 is a cross-sectional view showing the completed transistor according to the fourth embodiment of the present invention.
Figure 46:
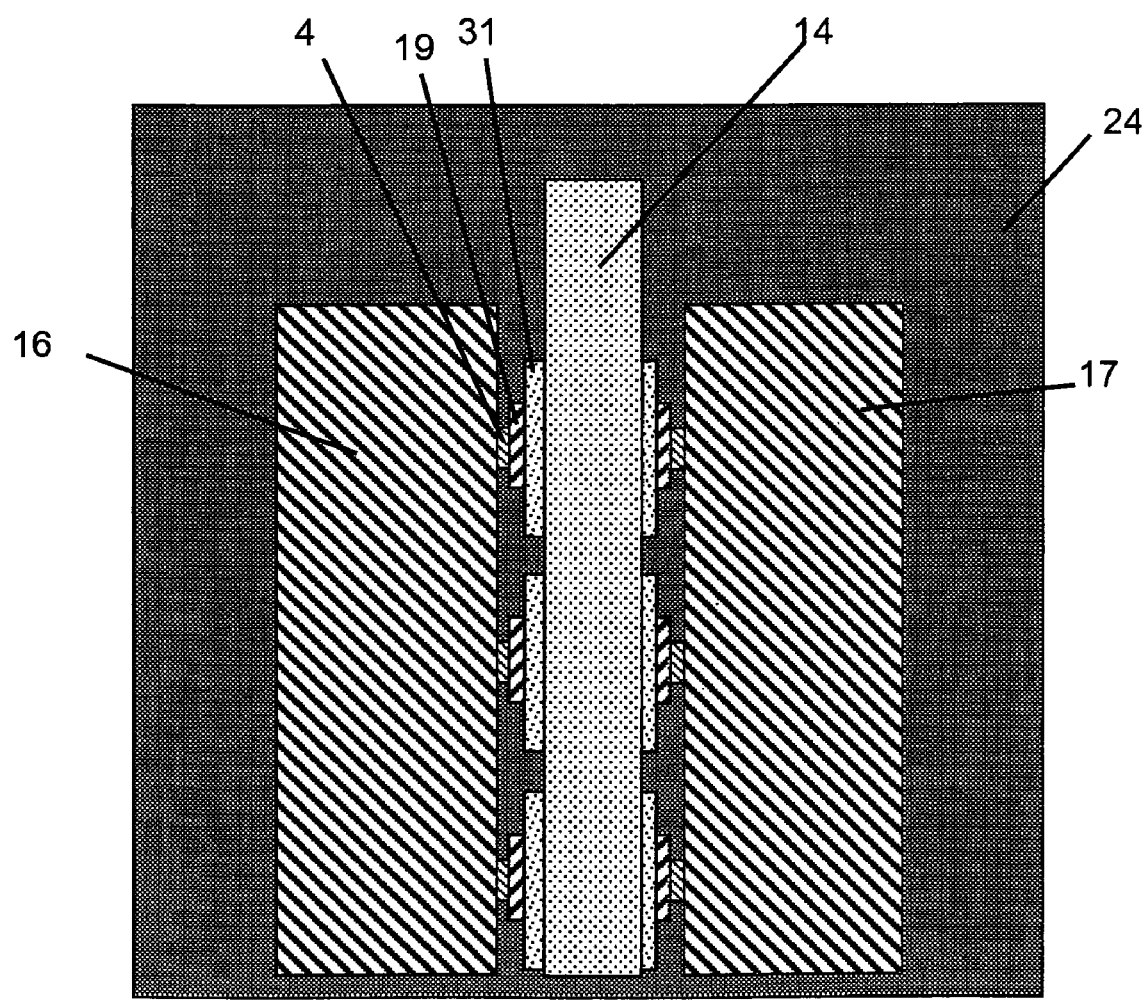
FIG. 46 is a plan view showing the transistor according to the fourth embodiment of the present invention seen from above.

Next, Al is deposited on the whole surface of the substrate and the organic insulator 29 made of polyimide is processed into a desired shape by the printing method. Thereafter, the wet etching of the Al is performed. In this manner, the source electrode 16 and the drain electrode 17 are successfully fabricated in the self-aligned manner as shown in FIG. 45. FIG. 46 shows the state at this time seen from above the substrate. As is apparent from FIG. 46, the source and drain electrodes 16 and 17 are electrically isolated from the gate electrode 14. Thereafter, the desired circuit is formed through the wiring process. In this process, N-methylpyrrolidone is used as the solvent for forming the opening in the part of the organic insulator 29. For reference, the schematic diagram of the transistor seen from above in which the organic insulator 29 is all removed is shown in FIG. 46.

As a result, this transistor exhibits very good characteristics and the variation in device characteristics can be reduced. Particularly, the variation in characteristics can be reduced more than any other embodiments in the present invention. For example, the variation in threshold voltage can be reduced to ±0.01 V.

In addition, in the case where the coaxial gate electrode 31 is formed as described in this embodiment, even if the silicon wires are disarrayed when the silicon wires are laminated, the potential of the coaxial gate electrode 31 connected by the gate electrode 14 can be flexibly controlled.

Fifth Embodiment

Figure 47:
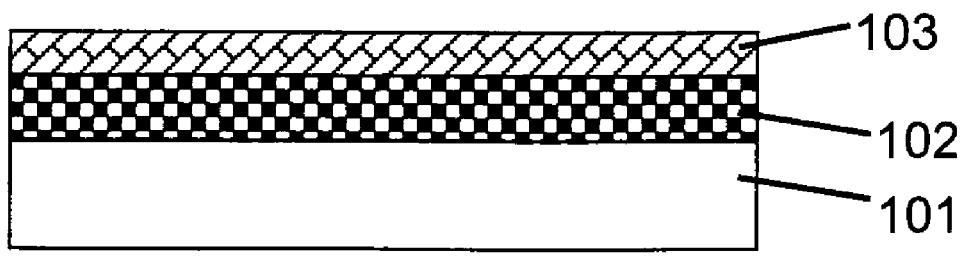
FIG. 47 is a cross-sectional view showing the manufacturing process of the transistor according to the fifth embodiment of the present invention.
Figure 48:
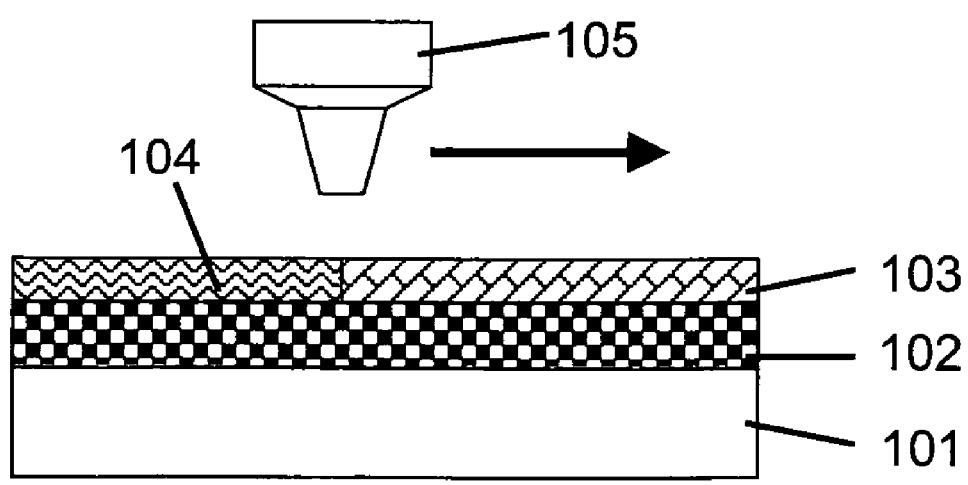
FIG. 48 is a cross-sectional view showing the manufacturing process of the transistor according to the fifth embodiment of the present invention.
Figure 49:
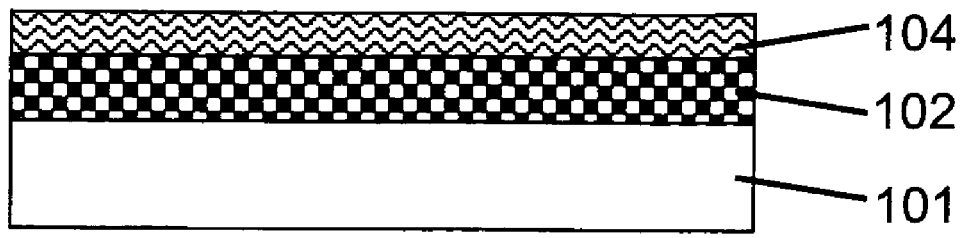
FIG. 49 is a cross-sectional view showing the manufacturing process of the transistor according to the fifth embodiment of the present invention.
Figure 50:
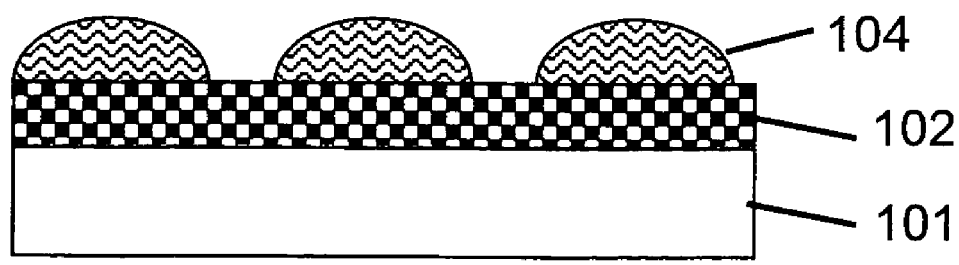
FIG. 50 is a cross-sectional view showing the manufacturing process of the transistor according to the fifth embodiment of the present invention.

Next, for the achievement of the third object of the present invention, the method of manufacturing silicon wires by using the laser annealing will be disclosed. By using this method, it becomes possible to fabricate the silicon wire transistor at low cost without using the SOI substrate. First, as shown in FIG. 47, an underlayer film 102 made of an Si oxide film with a thickness of about 100 nm and a thin amorphous Si film 103 with a thickness of about 50 to 200 nm are deposited on a substrate 101 by the CVD method. An Si nitride film or a laminated film of an Si oxide film and an Si nitride film is also available as the underlayer film. Thereafter, as shown in FIGS. 48 and 49, the amorphous Si film is scanned with a solid laser 105 in a predetermined direction to crystallize the amorphous Si film, thereby forming a thin single crystal Si film 104. FIG. 50 is a cross-sectional view of the single crystal Si film taken along the line vertical to the laser scanning direction. The amorphous Si film dissolved by the laser irradiation is aggregated by the surface tension, and a plurality of stripe-shaped Si single crystal films 104 (semiconductor pieces) with a half-oval cross section are formed.

Figure 51:
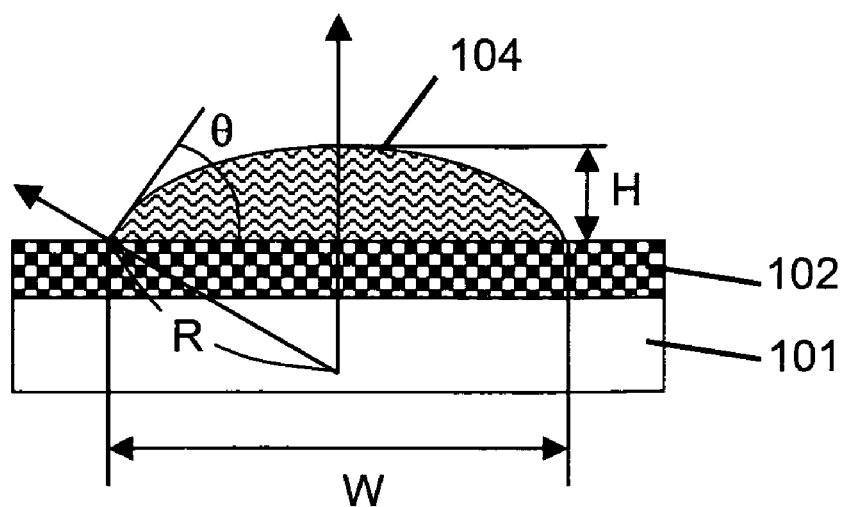
FIG. 51 is a cross-sectional view showing the manufacturing process of the transistor according to the fifth embodiment of the present invention.

FIG. 51 is a diagram showing the cross-sectional properties of the stripe-shaped Si single crystal films 104 formed on the substrate 101. The properties are defined by a width (W), a thickness (H), a curvature radius (R), and a contact angle with a substrate (θ) of the cross section of the crystal. These parameters are determined based on the thickness of the Si thin film on the substrate, the wettability between the Si thin film and the underlayer film, the surface tension of the Si thin film, the type of laser, and the scanning method. For example, when a sample of the amorphous Si film with a thickness of 50 nm is used, the stripe-shaped Si single crystal films with W of about 10 μm, H of about 100 nm, θ of about 30°, and the length of about 100 μm can be obtained.

Also, the method in which the amorphous Si film 103 is patterned into the stripe shape, and then, the solid laser is irradiated can be used as the method of crystallization in this embodiment. In this case, the Si single crystal films with an intended width (W) can be formed on the whose area of the substrate. The stripe-shaped Si single crystal films can be collected in the same manner as that described in the first embodiment. More specifically, the state in which the stripe-shaped Si single crystal films are formed is equivalent to the state of FIG. 4 in which the stripe-shaped silicon pieces are formed by the patterning using lithography. Therefore, also in this embodiment, the single crystal silicon wires 104 are collected and dispersed into a solution in the same manner as described in the first embodiment.

Sixth Embodiment

Next, another method for the achievement of the third object of the present invention will be disclosed. In this method, the single crystal silicon substrate is used. Therefore, it is possible to collect a large number of silicon wires at low cost. First, a single crystal silicon substrate 3 is prepared. Regarding the surface orientation of the silicon substrate 3, the substrate having the (100) surface thereon is used for the silicon wires to be used for forming the nMOS, and the substrate having the (110) surface thereon is used for the silicon wires to be used for forming the pMOS. When using the surface orientations described above, the mobility of the fabricated transistor can be maximized. Also, in this embodiment, the silicon layer 3 is doped to both p type and n type. The silicon wire 4 doped to p type is operated on the inversion side and thus functions as an nMOS, and the silicon wire 4 doped to n type is operated on the storage side and thus functions as a pMOS. Consequently, since the silicon wires are formed on different substrates in advance, it is possible to fabricate a CMOS comprised of the nMOS and pMOS which are fabricated by using the optimum surface orientations. This was impossible in the fabrication method of LSI in the prior art in which the nMOS and the pMOS are formed on the same silicon substrate.

Figure 61:
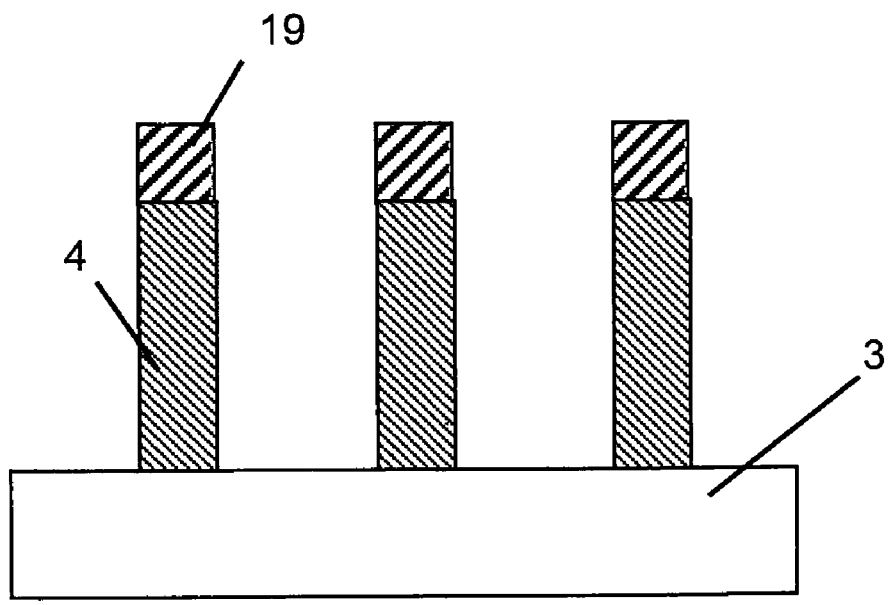
FIG. 61 is a cross-sectional view showing the manufacturing process of the transistor according to the sixth embodiment of the present invention.

Next, the surface of the silicon substrate 3 is oxidized at a high temperature of 1000° C. to form the gate insulating film 19 with a thickness of 100 nm. Subsequently, as shown in FIG. 61, trenches with a depth of 100 μm in a direction vertical to the silicon substrate 3 are formed through the process of lithography and dry etching. By doing so, the silicon wires 4 are formed. The width of the silicon wire 4 is 100 nm and the silicon wire is processed into a pillar shape. The distance between the adjacent silicon wires 4 is 200 nm so as to achieve the closest packing. The shape of the silicon wire 4 is not limited to the pillar shape, and the columnar shape and the polygonal-pillar shape are also available. For the increase of the ON-current, the silicon wire desirably has a large surface area and a large area used for the channel. The merit of using the silicon wire with a pillar shape in this embodiment is that the surface orientations present on the surface of the silicon wires 4 are the (100) surface for the nMOS and the (110) surface for the pMOS, and therefore, the surfaces capable of maximizing the mobility can be used for the channel.

Figure 62:
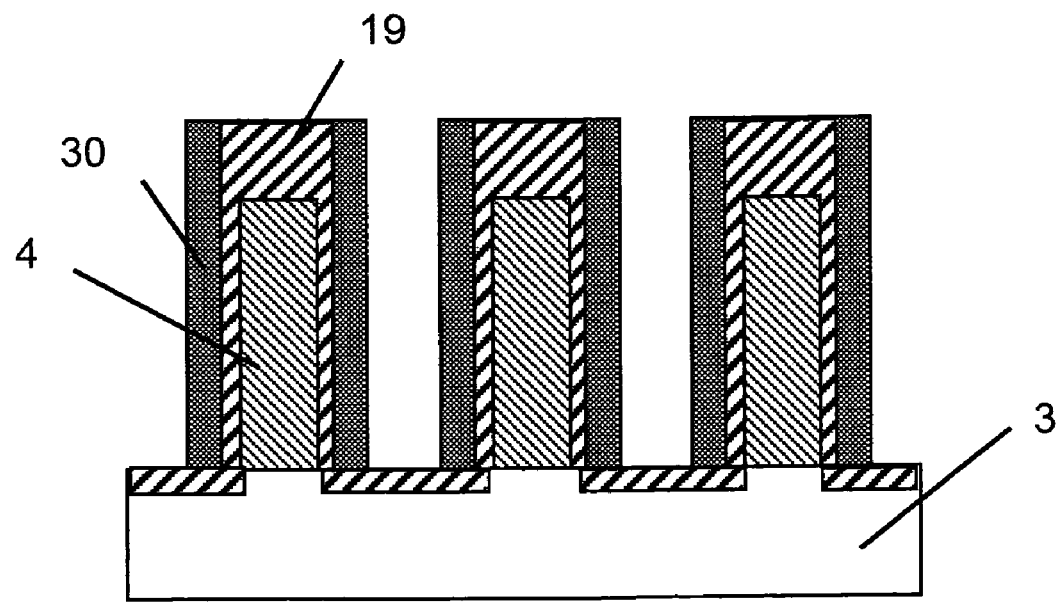
FIG. 62 is a cross-sectional view showing the manufacturing process of the transistor according to the sixth embodiment of the present invention.
Figure 63:
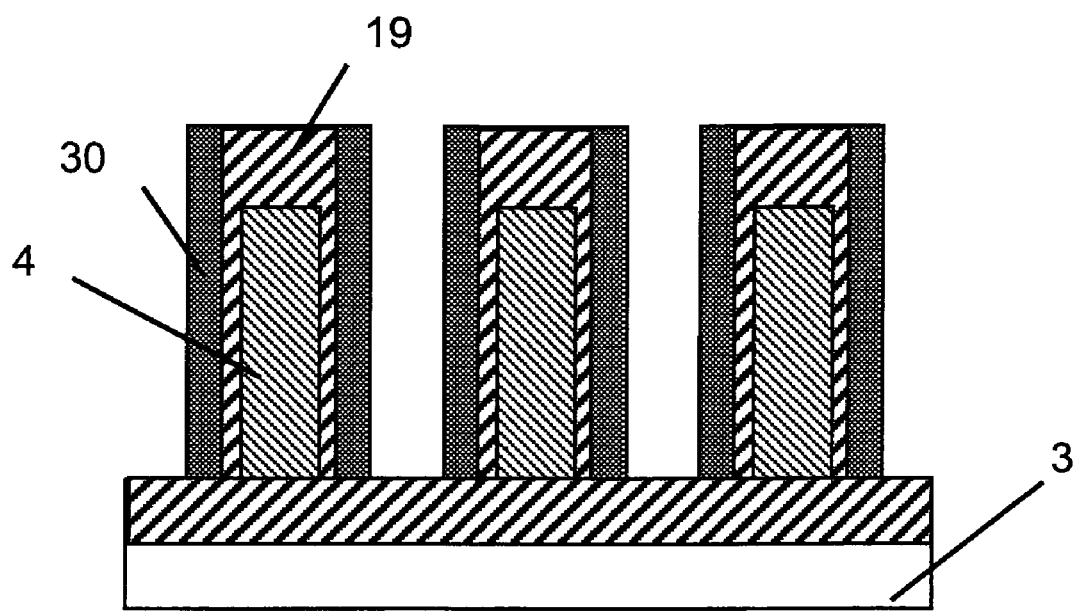
FIG. 63 is a cross-sectional view showing the manufacturing process of the transistor according to the sixth embodiment of the present invention.

Next, the surface of the silicon substrate 3 is oxidized at a high temperature of 1000° C. to form the gate insulating film 19 with a thickness of 5 nm also on the sidewall of the silicon wire 4. Subsequently, a silicon nitride film is deposited on the whole surface of the substrate, and then, the anisotropic dry etching is performed. By doing so, a sidewall insulating film 30 is formed on the sidewall of the gate insulating film 19 as shown in FIG. 62. Next, the gate insulating film 19 with a thickness of 100 nm is formed below lower end of the silicon wires 4 by the oxidation at 1000° C. as shown in FIG. 63. As described above, since the gate insulating film 19 is formed below the tip portion of the silicon wire 4, the silicon wires 4 are completely electrically isolated from the gate electrode.

Figure 64:
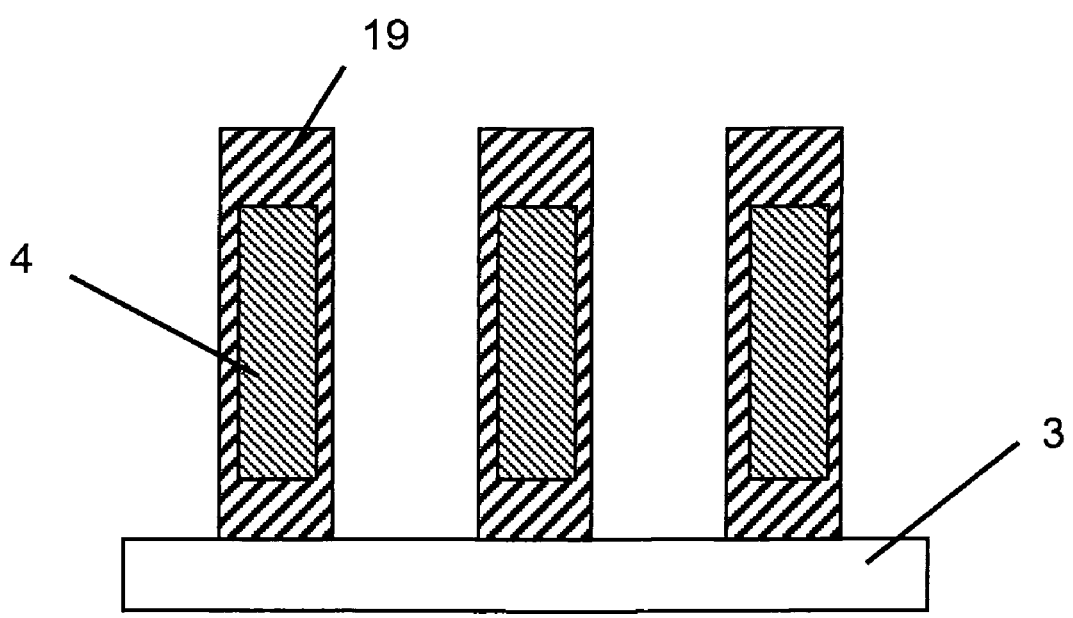
FIG. 64 is a cross-sectional view showing the manufacturing process of the transistor according to the sixth embodiment of the present invention.
Figure 65:
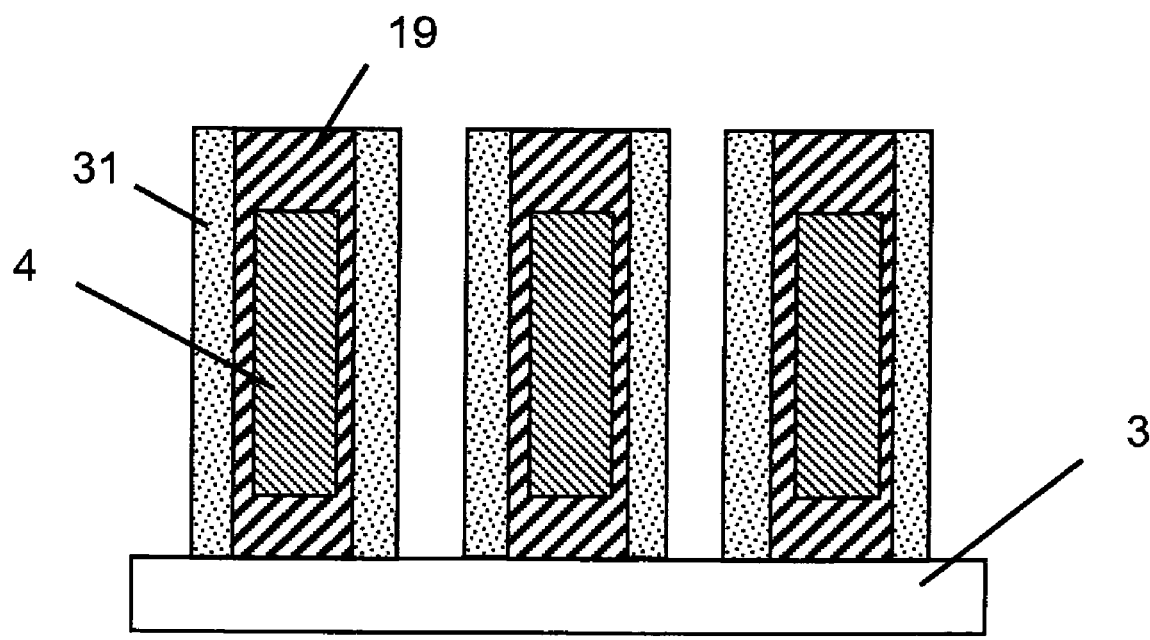
FIG. 65 is a cross-sectional view showing the manufacturing process of the transistor according to the sixth embodiment of the present invention.

Next, the sidewall insulating film 30 is removed by the wet etching as shown in FIG. 64. In this case, the gate insulating film 19 may be damaged by the process. Therefore, it is desirable that the gate insulating film 19 on the sidewall of the silicon wire 4 is once removed and then the gate insulating film 19 with a thickness of 5 nm is formed again by the oxidation at a high temperature of 1000° C. Next, a tungsten (W) film with a thickness of 10 nm and a titanium nitride (TiN) film with a thickness of 50 nm are deposited by using the chemical vapor deposition method, and then, the coaxial gate electrode 31 is formed only around the gate insulating film 19 by using the anisotropic etching as shown in FIG. 65.

Thereafter, the silicon wires 4 covered with the coaxial gate electrode 31 are separated from the substrate 3 by performing the wet etching using a solution containing hydrofluoric acid and nitric acid or a solution containing hydrazine. Then, the silicon wires 4 covered with the coaxial gate electrode 31 are arrayed on the plastic substrate 13 by using the printing method as shown in FIG. 40. Subsequently, the field effect transistors are integrated in the same manner as described in the fourth embodiment.

Here, the cost effectiveness resulting from the use of the method in this embodiment will be described. In this embodiment, the silicon wires are formed in the direction vertical to the surface of the silicon substrate 3. When the silicon wires are actually used on the plastic substrate 13, the silicon wires are arrayed in the direction parallel to the substrate surface. Therefore, the surface area can be increased in accordance with the horizontal to vertical ratio of the silicon wire 4. The ratio is about 1000 times in this embodiment because the horizontal to vertical ratio is 100 µm 100 nm. Actually, the silicon wires 4 cannot be collected from the all surface area of the silicon substrate 3, and the space between the adjacent silicon wires 4 cannot be used. However, even if only 25% of the surface area is used, the silicon wires 4 equivalent to two hundred and fifty times as much as the surface area of the silicon substrate can be collected from the silicon substrate 3 in one process. Furthermore, since the silicon substrate 3 usually has a thickness of about 750 µm, even if it is scraped in the surface planarization, the same silicon substrate 3 can be used at least three times. Therefore, the silicon wires 4 equivalent to seven hundred and fifty times as much as the surface area of the silicon substrate can be collected by repeating a plurality of processes. It corresponding to the reduction of cost of the silicon substrate 3 to 1/750. Therefore, the cost reduction indispensable for practically using the flexible device can be realized.

Seventh Embodiment

Figure 52:
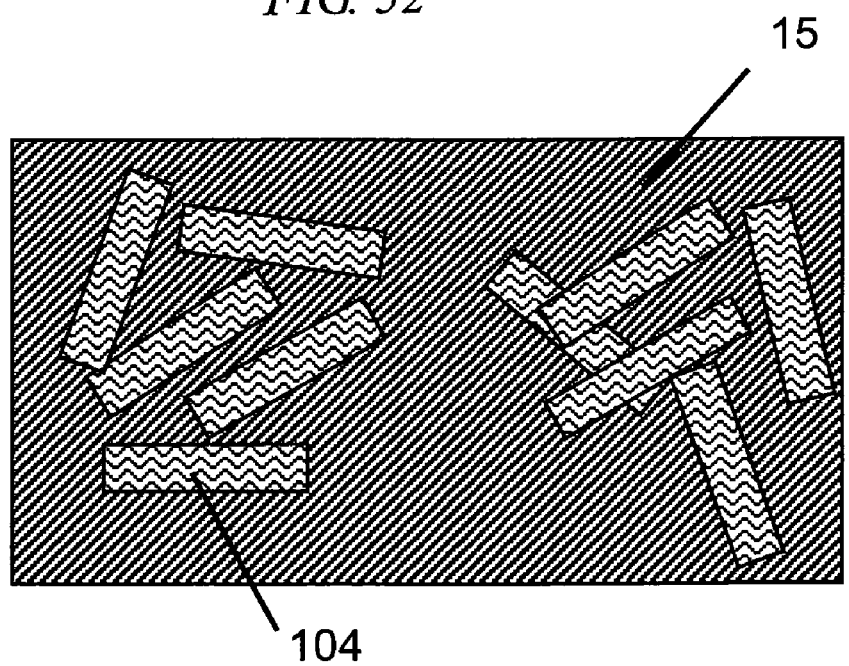
FIG. 52 is a plan view showing the manufacturing process of the transistor according to the seventh embodiment of the present invention seen from above.

Next, in this seventh embodiment, the method in which a plurality of transistors are formed on the same substrate will be described. Similar to the first embodiment, the gate electrodes are arrayed via the wiring on the plastic substrate, and the gate insulating film 15 is formed. Subsequently, a solution in which single crystal silicon wires 104 are dispersed is dropped on the region in which the transistor is to be fabricated as shown in FIG. 52. At this time, the single crystal silicon wires 104 are arrayed in random directions.

Figure 53:
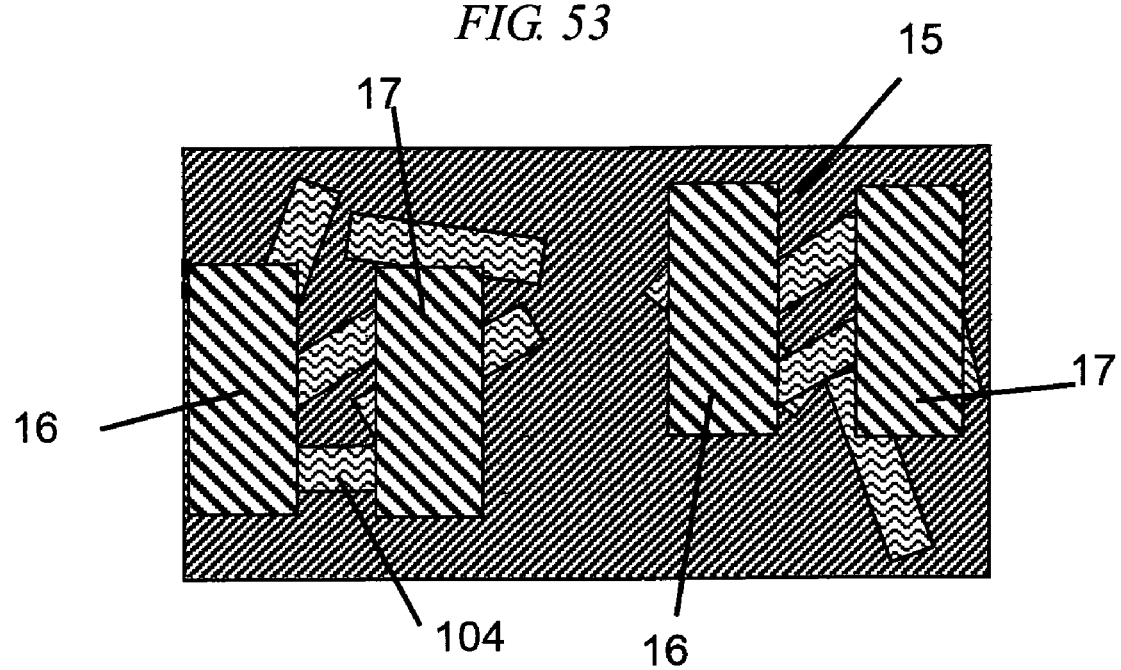
FIG. 53 is a plan view showing the manufacturing process of the transistor according to the seventh embodiment of the present invention seen from above.

Subsequently, the source electrodes 16 and the drain electrodes 17 are formed in desired regions by using the printing method (FIG. 53). At this time, since the single crystal silicon wires 104 are directed in random directions, some silicon wires do not connect the source electrode 16 and the drain electrode 17. However, they do not cause any problem if they do not connect the adjacent transistors. If the adjacent transistors are connected via the single crystal silicon wire 104, the circuit malfunction may occur. Therefore, the length of the single crystal silicon wire 104 is desirably set shorter than the interval between the adjacent device regions. The interval between the adjacent device regions in this case is defined as the shortest length between either of the source electrode 16 or the drain electrode 17 of a transistor and either of the source electrode 16 or the drain electrode 17 of another transistor adjacent to the transistor.

Figure 54:
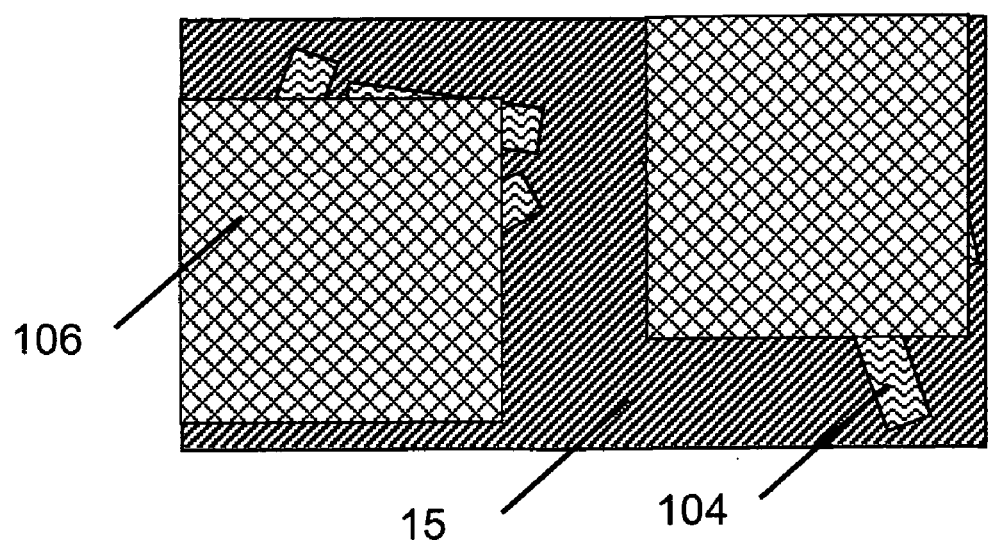
FIG. 54 is a plan view showing the manufacturing process of the transistor according to the seventh embodiment of the present invention seen from above.
Figure 55:
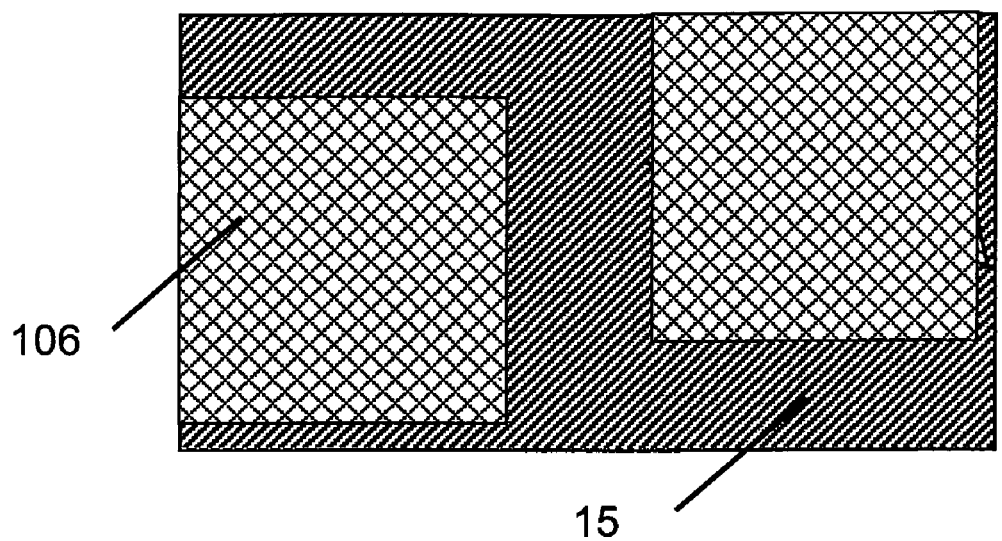
FIG. 55 is a plan view showing the completed transistor according to the seventh embodiment of the present invention seen from above.

Next, in order to electrically isolate the transistors from each other, an insulating film 106 is formed by using the printing method so as to cover the device regions. The insulating film 106 functions as a mask for device isolation and also functions as a protection film for protecting the silicon wires in the device isolation region from the etching solution. In this embodiment, polyimide is used as the insulating film 106 as shown in FIG. 54. Next, the single crystal silicon wires 104 protruding from the insulating film 106 are removed by the wet etching using hydrofluoric acid as shown in FIG. 55, thereby achieving the device isolation between the transistors. It is also possible to form the device isolation before forming the source electrodes and the drain electrodes or before forming the gate electrodes.

The characteristics of the transistor fabricated in the manner described above are good. However, since the single crystal silicon wires 104 are not arrayed in the same direction, the ON-current is low. However, this ON-current is one order of magnitude higher than that of the transistor using the polycrystalline silicon and having the same occupied area. This is because of the synergy between the high mobility resulting from the use of the single crystal silicon and the large effective transistor width (W) resulting from the wire shape. As described above, the silicon wire transistor having good transistor characteristics can be realized at far lower cost in comparison to the case of using the SOI substrate.

In this embodiment, the silicon wires are arrayed in random directions by using the dropping method. However, the method of this embodiment can be applied to the silicon wires arrayed in the same direction by using the Langmuir-Blodgett technique. Also, the silicon wires processed by the lithography technique are used in this embodiment. However, the method of this embodiment can be applied to the nanowires (semiconductor wires) formed by the crystal growth using metal nanoparticles other than the silicon wires described in the first to sixth embodiments. In the case of using the crystal growth, it is difficult to control the length of the nanowires. Therefore, the method in which the device isolation is achieved by using a resist pattern as described in this embodiment is quite effective as the method for preventing the short-circuit between the devices.

Further, the method for preventing the short-circuit between the devices in this embodiment can be omitted for the reduction of the manufacturing cost. In this case, since the array of the silicon wires can be controlled by using the printing method, if the axial length of the silicon wires are set shorter than half of the interval between the adjacent device regions, the short-circuit due to the contact of the silicon wires protruding from the device regions can be prevented.

For the simplification of the process, the SOI substrate formed by the bonding method or the SIMOX (Separation by Implanted Oxygen) method is used in the first to fourth embodiments. However, it is also possible to prepare the same structure in a different way. For example, instead of the SOI substrate, a normal CZ silicon substrate is prepared as the silicon substrate 3, and the oxide film 2 is formed by the thermal oxidation of the surface thereof, and then, the polycrystalline silicon is deposited thereon. In this manner, the polycrystalline silicon can be used as the silicon layer 1. In this case, the mobility is about 10 $cm^2/Vs$ which is one order of magnitude lower than that of the case of using the single crystal silicon. However, it is one order of magnitude higher than that of the case of using the organic semiconductor. As described above, since most characteristics required for the flexible device can be achieved by using the polycrystalline silicon, there is no problem if the polycrystalline silicon is used as the silicon layer. Of course, the high mobility is desirable in order to operate the circuit at high speed, and for such a purpose, the single crystal is desirable. In addition, it is also obvious that, even when a different insulating film, for example, a silicon nitride film is used instead of the oxide film 2, the silicon wires can be formed through the same process if only the solution used in the wet etching is changed. Also, the case where the method of the present invention is applied to the silicon wire has been described in the first to seventh embodiments. However, the method can be applied also to other semiconductor material such as compound semiconductor.

What is claimed is:

1. A manufacturing method of a field effect transistor, comprising the steps of:

(a) preparing an SOI substrate having a first substrate, an insulating film formed on said first substrate, and a semiconductor layer formed on said insulating film;

(b) processing said semiconductor layer into semiconductor pieces;

(c) partly removing said insulating film below said semiconductor pieces;

(d) forming an organic material film which partly covers an upper surface and a lower surface of said semiconductor pieces located in a region where said insulating film has been removed in said step (c) and covers a surface of said first substrate;

(e) separating said semiconductor pieces from said insulating film;

(f) dissolving said organic material film into organic solvent to separate said semiconductor pieces from said first substrate, and then, collecting said semiconductor pieces; and (g) forming a field effect transistor on a second substrate by using said semiconductor pieces.

2. The manufacturing method of a field effect transistor according to claim 1,
   wherein said step (b) is a process for processing said semiconductor layer using a resist film as a mask.

3. The manufacturing method of a field effect transistor according to claim 1,
   wherein said organic material film is a resist film.

4. The manufacturing method of a field effect transistor according to claim 1,
   wherein said step (e) is a process for separating said semiconductor pieces from said insulating film by removing said semiconductor pieces or said insulating film at a junction portion therebetween.

* * * * *